United States Patent [19]
Brown et al.

[11] Patent Number: 5,939,767
[45] Date of Patent: Aug. 17, 1999

[54] STRUCTURE AND PROCESS FOR BURIED DIODE FORMATION IN CMOS

[75] Inventors: Jeffrey S. Brown, Jeffersonville; Steven J. Holmes, Milton; Robert K. Leidy, Burlington; Steven H. Voldman, South Burlington, all of Vt.

[73] Assignee: International Business Machines Corporation, Armonk, N.Y.

[21] Appl. No.: 09/052,512

[22] Filed: Mar. 31, 1998

Related U.S. Application Data

[62] Division of application No. 08/852,850, May 7, 1997.

[51] Int. Cl.$^6$ .......................... H01L 29/00; H01L 29/861; H01L 31/107
[52] U.S. Cl. .......................... 257/551; 257/481; 257/603; 257/355
[58] Field of Search .................................. 257/355, 173, 257/106, 199, 481, 551, 603

[56] References Cited

U.S. PATENT DOCUMENTS

| | | | |
|---|---|---|---|
| 4,405,708 | 9/1983 | van Pelt et al. | 430/281 |
| 4,568,631 | 2/1986 | Badami et al. | 430/315 |
| 4,687,730 | 8/1987 | Eron | 430/324 |
| 4,707,218 | 11/1987 | Giammarco et al. | 156/643 |
| 4,799,990 | 1/1989 | Kerbaugh et al. | 156/636 |
| 5,330,879 | 7/1994 | Dennison | 430/313 |
| 5,343,053 | 8/1994 | Avery | 257/173 |
| 5,500,546 | 3/1996 | Marum et al. | 257/358 |

FOREIGN PATENT DOCUMENTS

5-297597  11/1993  Japan .

OTHER PUBLICATIONS

J.M. Never and S.H. Voldman, Failure analysis of shallow trench isolated ESD structures, Journal of Electrostatics, vol. 38, pp. 93–112, (1996).

S.H. Voldman, S.S. furkay, and J.R. Slinkman, Three–dimensional transient electrothermal simulation of electrostatic discharge protection circuits, Journal of Electrostatics, vol. 36, pp. 55–80, (1995).

*Primary Examiner*—Carl Whitehead, Jr.
*Assistant Examiner*—Jesse A. Fenty
*Attorney, Agent, or Firm*—Schmeiser, Olson & Watts; Eugene I. Shkurko

[57] ABSTRACT

According to the present invention, an improved method for buried diode formation in CMOS processing is disclosed. Using a hybrid photoresist process, a self-aligning Zener diode is created using a two-step photolithography mask process. Since the process disclosed in the invention uses only the p-well and the n-well masks to create the Zener diode, photolithography alignment problems are reduced and Zener diodes can be create at the sub-micron scale.

8 Claims, 25 Drawing Sheets

STRUCTURE AND PROCESS FOR BURIED DIODE FORMATION IN CMOS

RELATED APPLICATIONS

This application is related to the following co-pending U.S. patent applications, Ser. No. 08/715,288, Docket No. FI9-96-055, for "Low 'K' Factor Hybrid Photoresist," and Ser. No. 08/715,287, Docket No. BU9-96-047, for "Frequency Doubling Photoresist," both filed Sep. 16, 1996. This application is a division of the earlier patent application by Brown et al. entitled "STRUCTURE AND PROCESS FOR BURIED DIODE FORMATION IN CMOS", Ser. No. 08/852,850, filed on May 7, 1997.

BACKGROUND OF THE INVENTION

1. Technical Field

This invention generally relates to the field of semiconductor processing and integrated circuit manufacturing. More specifically, the present invention relates to improving the fabrication process for certain integrated circuit devices.

2. Background Art

Today, our society is heavily dependent on high-tech electronic devices for everyday activity. Integrated circuits are the components that give life to our electronic devices. Integrated circuits are found in widespread use throughout our country, in appliances, televisions and personal computers, and even in automobiles. Additionally, modern manufacturing and production facilities are becoming increasingly dependent on the use of machines controlled by integrated circuits for operational and production efficiencies. Indeed, in many ways, our everyday life could not function as it does without integrated circuits. These integrated circuits are manufactured in huge quantities in our country and abroad. Improved integrated circuit manufacturing processes have led to drastic price reductions and performance enhancements for these devices.

The traditional integrated circuit fabrication process is a series of steps by which a geometric pattern or set of geometric patterns is transformed into an operational integrated circuit. An integrated circuit consists of superimposed layers of conducting, insulating, and device-forming materials. By arranging predetermined geometric shapes in each of these layers, an integrated circuit that performs the desired function may be constructed. The overall fabrication process consists of the patterning of a particular sequence of successive layers. The patterning process used to fabricate integrated circuits is typically performed using lithography followed by a variety of subtractive (etch) and additive (deposition) processes.

Photolithography, a type of lithographic process, is used in the manufacturing of semiconductor devices, integrated optics, and photomasks. The process typically involves the following steps: applying a layer of a material (known as a photoresist, or resist) that will react when exposed to actinic or activating energy; exposing portions of the photoresist to actinic energy such as light or other ionizing radiation, i.e., ultraviolet, electron beams, X-rays, etc., thereby changing the solubility of portions of the resist; and developing the resist by washing it with a basic developer solution, such as tetramethylammonium hydroxide ("TMAH"), thereby removing the non-irradiated (in a negative resist) or irradiated (in a positive resist) portions of the layer.

As the need for higher and higher levels of integration has arisen in the industry, the need for a larger number of patterns, lines, and spaces in a given area has increased dramatically. In response, the scaling of lithographic features has been an essential aspect of enhancing the performance and density of semiconductor devices. Lithographic scaling has been achieved primarily by three methods: increasing the numerical aperture (NA) of the exposure tool; reducing the exposure wavelength of the actinic energy or ionizing radiation source; and improving the response of the photoresist. These three parameters are expressed in the Rayleigh model for lithographic resolution, as given by the equation:

$$R = k\lambda/NA$$

where R is the resolution, k is an empirically derived parameter that is dependent on photoresist performance, $\lambda$ is the exposure wavelength, and NA is the numerical aperture of the expose tool.

The "k" factor is reduced by resists that can provide a wider focus/expose process window for a high resolution feature. Historically, this "k" factor has been reduced by altering the resist components, for example: by adding resins and sensitizers with higher contrast; employing thinner resist films; and using antireflective films. The reduction of the "k" factor is becoming more important because NA values are reaching their limit at 65–70, and because development work at reducing the expose wavelength from the state-of-the art of 248 nm is still in preliminary stages. There are, however, practical limits to the current state of the art in photolithography.

Integrated circuits are chemically and physically integrated into a substrate material, such as a silicon or gallium arsenide wafer, by combining electrically conductive, semiconductive, and dielectric (insulating) layers or regions. The layers and regions are arranged to form electronic components or devices such as transistors, diodes, and capacitors. Thousands of these devices are formed essentially simultaneously on the surface of a single wafer of semiconductor material during processing.

For example, in a typical fabrication process, a layer of aluminum or some other metal is deposited on the surface of the wafer substrate. The metal layer is patterned to form interconnect paths along the surface of the wafer substrate. The substrate typically contains certain dopant materials which form transistor components. Examples of possible substrate components include N-well or P-well sources, drains, and junctions. In most processes, an insulating or dielectric layer is then deposited over the first metal layer. Vias, or holes, are then created in the dielectric layer and a second metal layer is deposited over the dielectric layer. The second metal layer covers the intervening dielectric layer and fills the via openings in the dielectric layer down to the first metal layer. These filled via openings provide electrical connections between the first and second metal layers. The second metal layer is also patterned to form additional circuit devices and paths. The dielectric layer acts as an insulator between the first and second metal layer. This process can be repeated with additional layers as necessary to create the desired functionality in the circuits located on the wafer. Additional circuit components such as isolation regions, wells, and gates are discussed below.

Many circuits manufactured today incorporate shallow trench isolation (STI) areas as part of the fabrication process. STI regions are typically used to electrically isolate certain circuit components from other circuit components. An STI region is typically created by etching a trench in the surface of the wafer and filling it with oxide, followed by polishing the surface. The n-well region and the p-well region are complementary regions typically formed by selectively masking the surface of the silicon wafer, with an n-well mask and a p-well mask, ion implanting a dopant species, followed by an annealing process to activate the dopant species. The n-well is typically created used phosphorous ion dopant implants and the p-well is typically created using boron ion dopant implants. The n-well mask and p-well mask are used.

The gate material is formed over the diffusion region by depositing a polysilicon layer followed by a directional etch. Spacers are put on the edge of the fabricated devices using oxide or nitride layers. The source and drain diffusions are then created, typically by implanting boron and antimony (for p++ device regions) or arsenic and phosphorous (for n++ device regions).

A diode is an important circuit element. In a forward bias mode, a p-n diode conducts current after the forward diode voltage is exceeded according to the equation:

$$I=I_{sat}(e^{qV/kT}-1)$$

In the reverse bias mode, low level saturation leakage current flows until the breakdown voltage is exceeded. Avalanche breakdown voltage is the voltage where avalanche multiplication in the p-n diode depletion region is significant. At very high dopings, Zener breakdown occurs prior to avalanche breakdown. Both avalanche and Zener breakdown are non-destructive and allow for significant current to flow in the reverse biased configuration when these voltages are achieved.

A Zener or avalanche diode can have multiple applications. A Zener or avalanche diode can be fabricated so that it can be used to protect valuable or sensitive circuitry in IC semiconductors. These protective diodes can be integrated into an IC CMOS process with electronic circuitry or as independent semiconductor devices.

Zener diodes and avalanche diodes can also be used for on-chip electrostatic discharge protection (ESD) applications as independent diode elements or part of ESD devices or circuits. ESD networks can use Zener breakdown or avalanche breakdown to trigger the ESD network in overvoltage conditions.

ESD can be caused by charge build-up that can occur at several different stages of the integrated circuit fabrication process. For example, charge can be accumulated and discharged from module packaging machines, workers handling the packaged devices and contacting the circuit package input-output pins, etc. In addition, during exposure to plasma processing during the fabrication process, the polysilicon materials in the integrated circuit can accumulate an electrical charge that can cause damage to the gates of the integrated circuits. To prevent inadvertent circuit failure due to ESD, Zener diodes are placed into the circuit where they can act as buffers. When using Zener diodes to protect a circuit, the breakdown voltage of a diode must be low enough to ensure that either avalanche multiplication breakdown or Zener breakdown occurs prior to dielectric overvoltage or MOSFET secondary breakdown in the component circuitry.

As gate dielectric gets thinner, the use of standard n+ implants and wells as overvoltage "floating gate" tie downs becomes less useful due to the high breakdown voltage of the n+ implants and well implants. A typical diffusion breakdown exceeds 10 V while the gate dielectric breakdown voltage is decreasing well below this level in highly scaled VLSI CMOS devices. Hence, low breakdown voltage elements will be required.

Most integrated circuits are packaged with pins which are connected to input-output pads, thereby providing connections to the outside world. In a typical environment, the avalanche or Zener diode will be fabricated so as to protect the circuit connected to the input-output pads to an ESD human body model (HBM) specification of 2,000 v–4,000 v.

In a typical CMOS process, an avalanche or Zener diode is created when an n diffusion and p diffusion are abutted by implanting them next to each other. In some cases, the diffusions are slightly overlapped and in other cases a gate structure is included. Abutted junctions created in this fashion are typically unreliable and have variable leakage characteristics from junction to junction due to poor process control. This creates a diode that "leaks". However, as integrated circuit processing techniques have become more sophisticated, and as devices were increasingly scaled, the resistivity of the diffusions weren't keeping pace, so silicide processes were adopted to reduce the resistivity of the n diffusions and p diffusions. Silicides are typically created by placing a layer of refractory material such as titanium or cobalt over the surface of the wafer and then heating the wafer at a temperature range of 600° C.–700° C. Heating the wafer causes the silicon or polysilicon to react with the refractory materials to form suicides. The unreacted titanium on the oxide portions of the wafer is removed. The net result of the process is a low resistivity titanium suicide region wherever there is polysilicon and an n-diffusion or a p-diffusion. The silicide process, however, shunts or bridges the typical Zener diode and removes it from the circuit. Hence, with the silicide process shunting the abutted diode structure, no diode occurs.

It is becoming increasingly difficult to effectively create Zener diodes in certain integrated circuit processes. As explained above, device scaling is becoming an integral part of semiconductor design and fabrication processing. However, as scaling takes place, the gate oxide of the integrated circuit devices has become substantially thinner than the gate oxide used in earlier processes. Because of this, the breakdown voltage of the Zener diode may exceed the breakdown voltage of the gate oxide of a given integrated circuit device. If this happens, then the Zener diode is no longer capable of protecting the integrated circuit device and the device will suffer breakdown and fail before the Zener diode fails.

Given the increased demand for integrated circuits with ever smaller surface area, buried diodes are more desirable because they don't require any additional surface area. However, although buried Zener diodes can be fabricated using conventional methods, the current technology requires the use of at least four mask steps. This is time-consuming and significantly increases production costs. In addition, the alignment problems associated with using four masks severely restricts the possible size reductions of a typical Zener diode, making controlled fabrication of suitable Zener diodes at the sub-micron scale difficult, if not impossible.

In summary, although Zener diodes can be fabricated on the surface of a wafer, this process is not desirable because the Zener diode will consume valuable surface area, thereby restricting the reductions in the overall size of the circuit. Further, although buried Zener diodes can be fabricated using current technology, they cannot be made small enough for new, sub-micron sized circuit components.

Therefore, there exists a need to provide an improved method of creating buried Zener diodes with breakdown voltage levels which are low enough to protect integrated circuit components and gates from premature breakdown and ESD. Without additional methods for successfully creating more effective protective circuits and preparing new devices in integrated circuit manufacturing, additional design improvements, enhanced circuit performance, improved yield, and improved operational characteristics may be difficult to obtain.

DISCLOSURE OF INVENTION

According to the present invention, an improved method for buried diode formation in CMOS processing is disclosed. Using a hybrid photoresist process, a self-aligning Zener diode is created using a two-step photolithography mask process. Since the process disclosed in the invention uses only the standard p-well and n-well masks to create the Zener diode, fewer process masks are required, photolithography alignment problems are reduced, and Zener diodes can be reliably created at the sub-micron scale.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

Figure 1:
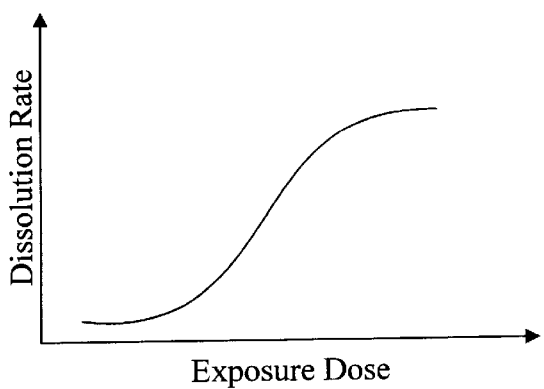
FIG. 1 is a graph depicting the solubility of positive resist as a function of exposure dose.

The Overview Section immediately below is intended to provide an introductory explanation of manufacturing a hybrid photoresist and fabricating integrated circuits using a hybrid photoresist suitable for use with the present invention for individuals who need additional background in this area. Those who are skilled in the manufacture and use of hybrid photoresist may wish to skip this section and begin with the Detailed Description Section instead.

Overview—Hybrid Photoresist

The preferred embodiments of the present invention use a hybrid photoresist material having, simultaneously, both a positive tone and a negative tone response to exposure.

As a hybrid resist is exposed with actinic radiation, areas exposed with high intensity radiation form a negative tone line image. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 μm and less can be printed with current deep ultra violet (DUV) lithography tools that are designed for operation at 0.35 μm resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 μm feature with conventional resist generally requires a 0.2 μm reticle image size. With hybrid resist, a 0.2 μm space can be formed with a single edge of a reticle feature; for example, a 0.5 μm reticle opening could produce two 0.2 μm spaces and a 0.2 μm line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 μm and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate. Accordingly, the hybrid resist used in the preferred embodiment of the present invention provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature.

Figure 2:
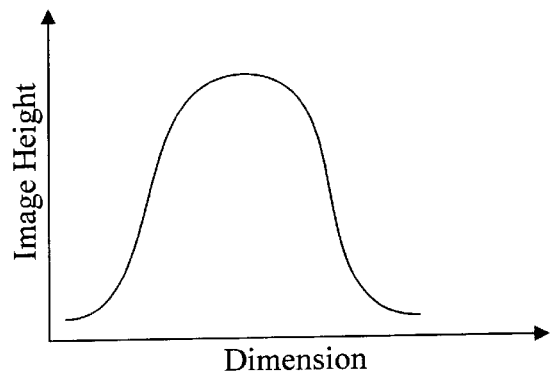
FIG. 2 is a graph depicting the line pattern when a substrate is printed with a reticle line pattern using a positive resist.
Figure 3:
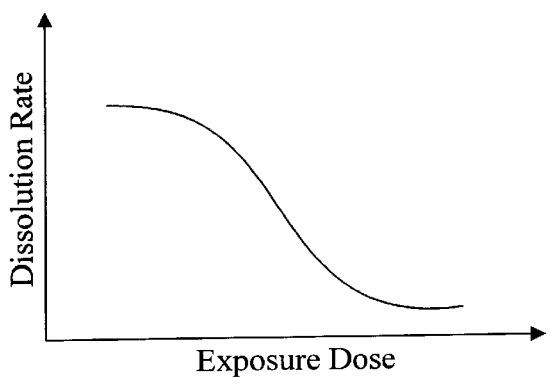
FIG. 3 is a graph depicting the solubility of negative resist as a function of exposure dose.
Figure 4:
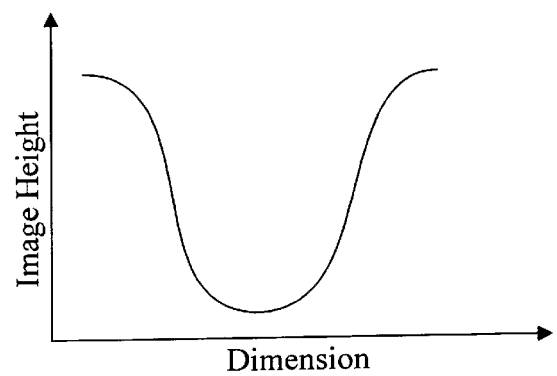
FIG. 4 is a graph depicting the line pattern when a substrate is printed with a reticle line pattern using a negative resist.

As shown in FIG. 1, the positive resist undergoes an increase in solubility as the exposure dose is increased. This results in a resist line pattern that looks like the curve shown in FIG. 2 when a substrate is printed with a reticle line pattern. On the other hand, in the negative resist system exposed areas undergo a reduction in solubility as the exposure dose is increased as shown in FIG. 3. This results in a line space pattern that looks like the graph shown in FIG. 4 when a substrate is printed with a reticle line pattern.

Figure 5:
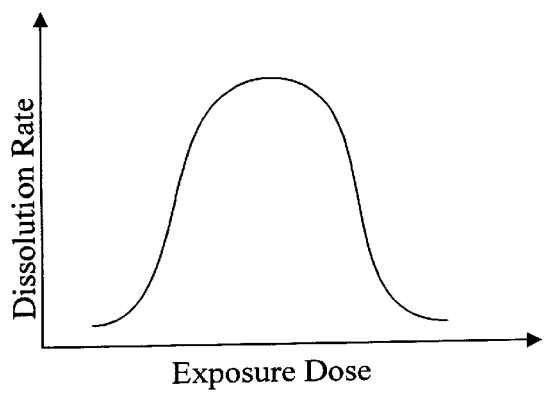
FIG. 5 is a graph depicting the solubility of a hybrid resist as a function of exposure dose.
Figure 6:
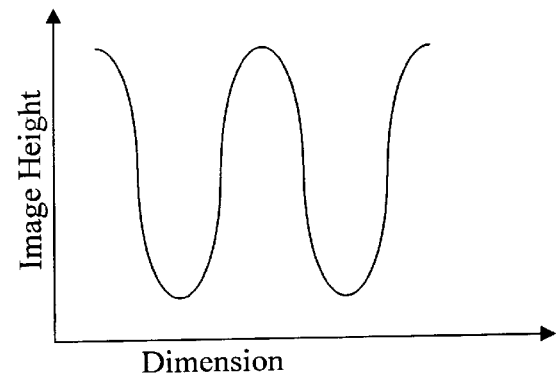
FIG. 6 is a graph of the "frequency doubled" space/line/space pattern attainable with a hybrid resist.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. The resultant graph of the resist solubility as a function of exposure dose is shown in FIG. 5. Printing a reticle line pattern onto a substrate results in the space/line/space pattern shown in FIG. 6. In this manner, the aerial image is "frequency doubled" to produce twice the number of features than would otherwise be attainable with a standard resist.

Figure 7:
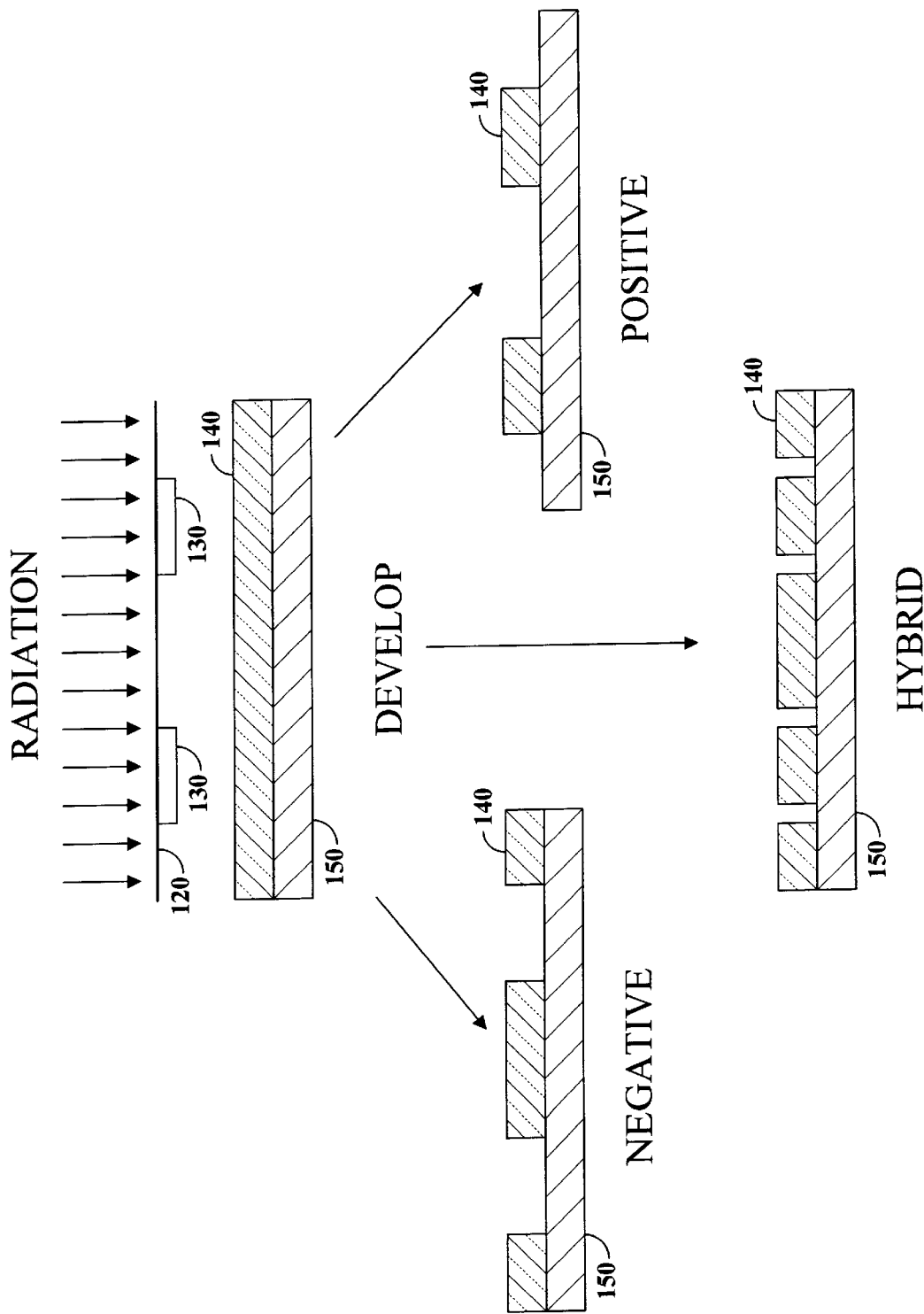
FIG. 7 is a schematic diagram showing the use of the hybrid resist.

FIG. 7 illustrates the salient differences between a positive resist, a negative resist, and a hybrid resist. In FIG. 7, a hybrid photoresist 140 has been deposited over the surface of substrate 150. A mask 120 with chrome areas 130 is used to selectively mask portions of photoresist 140 from a radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 7, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
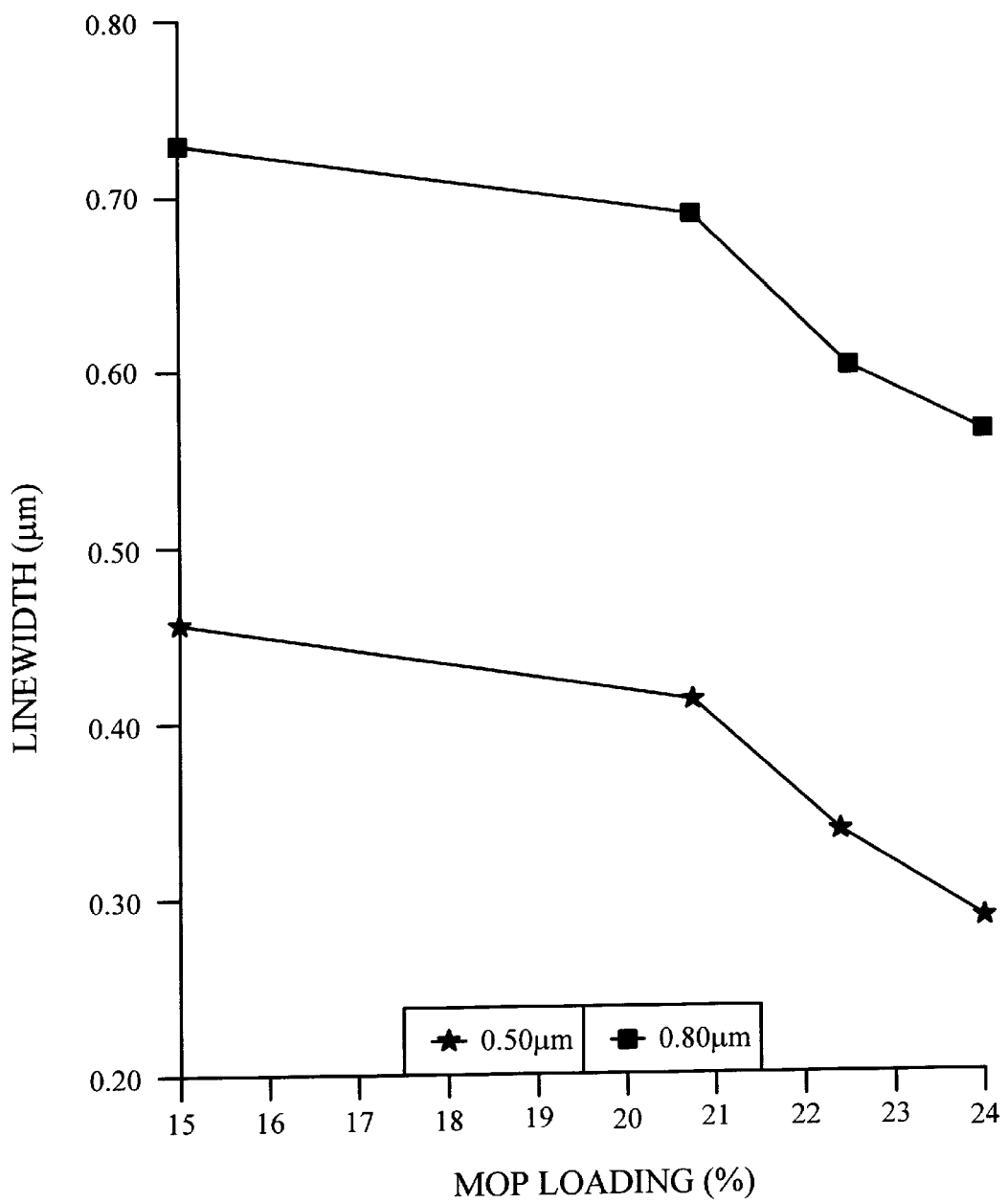
FIG. 10 is a graph showing the linewidth in nm plotted against the amount of positive tone solubility inhibitor (MOP) incorporated in a hybrid resist of the present invention.
Figure 15:
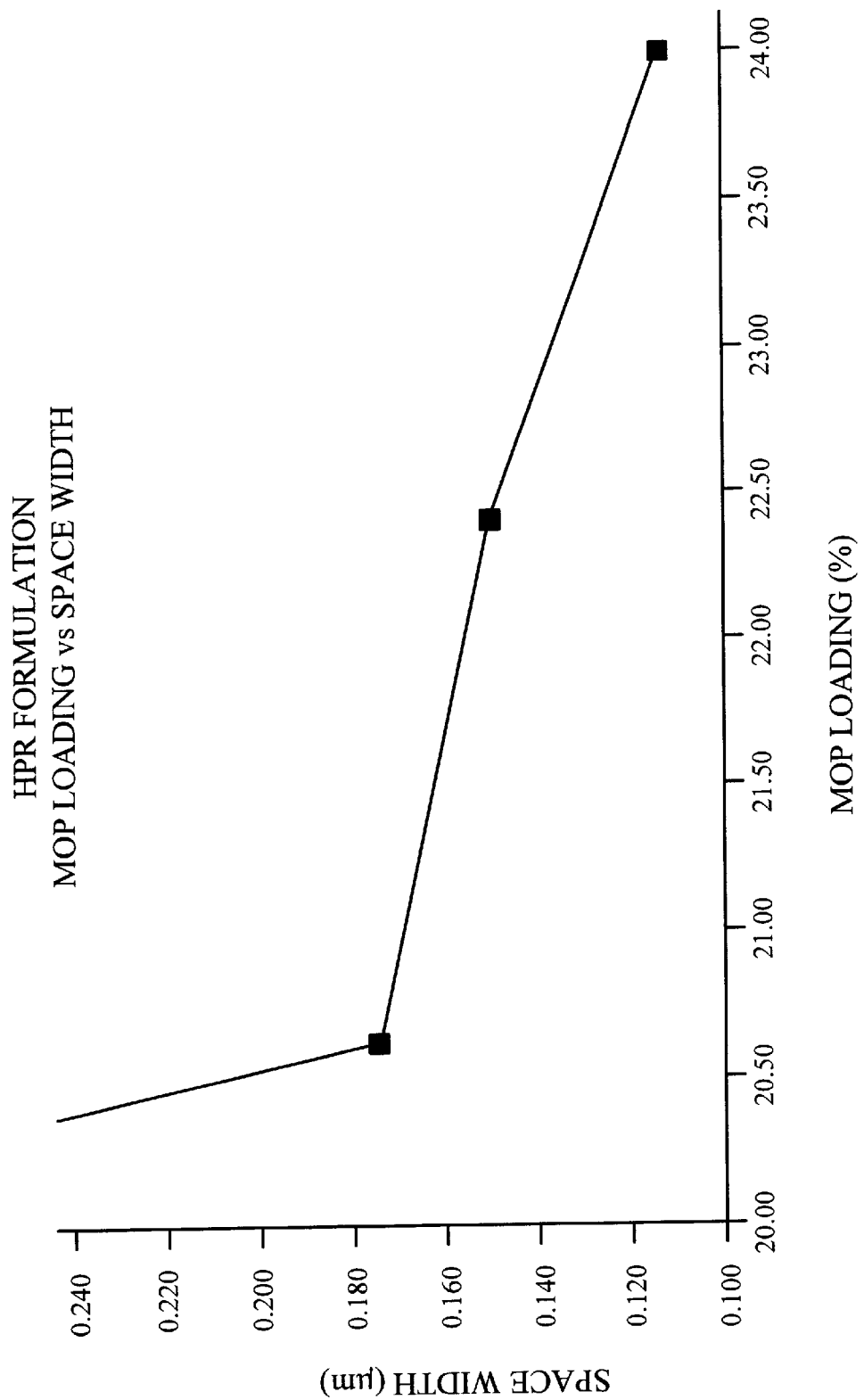
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
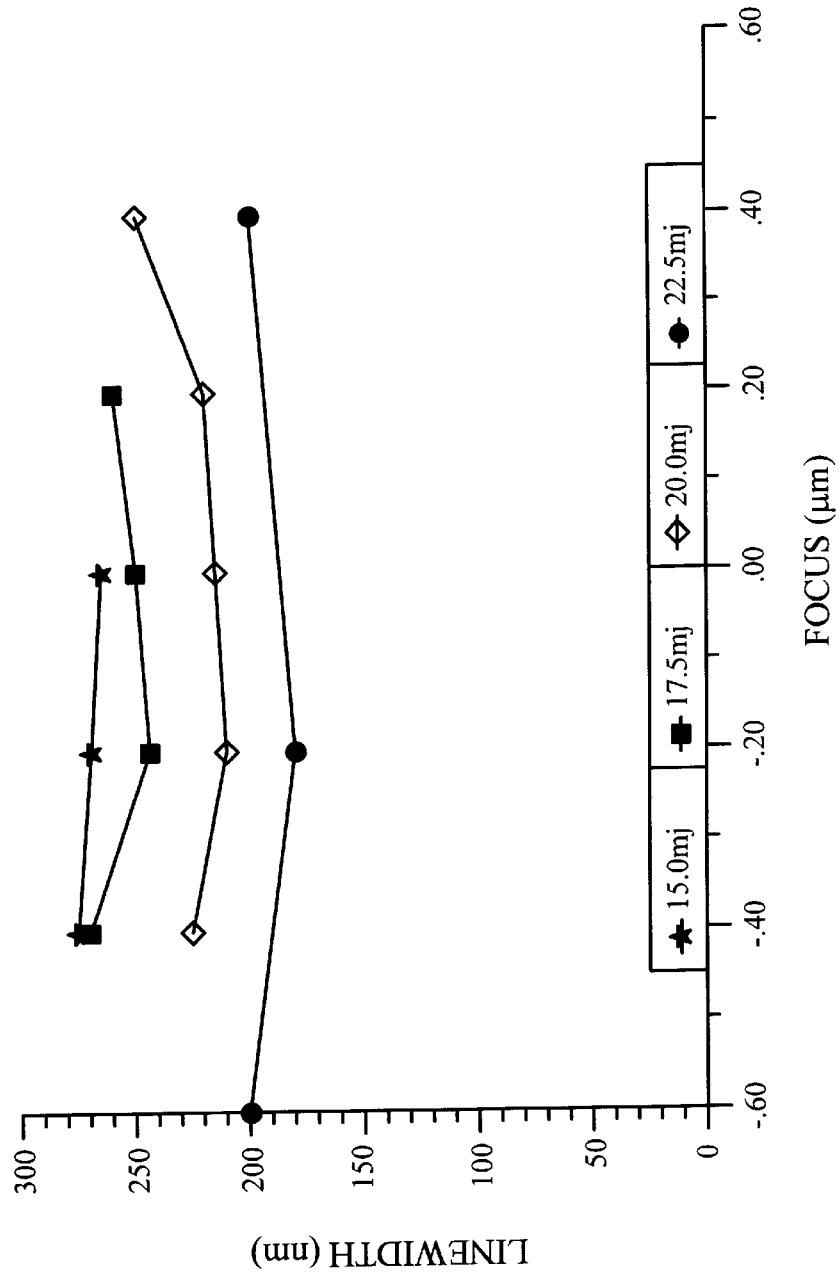
FIG. 8 is a graph of linewidth in nanometers (nm) plotted against focus in microns ($\mu$m) of a formulation of a standard negative resist at various exposure energies.
Figure 9:
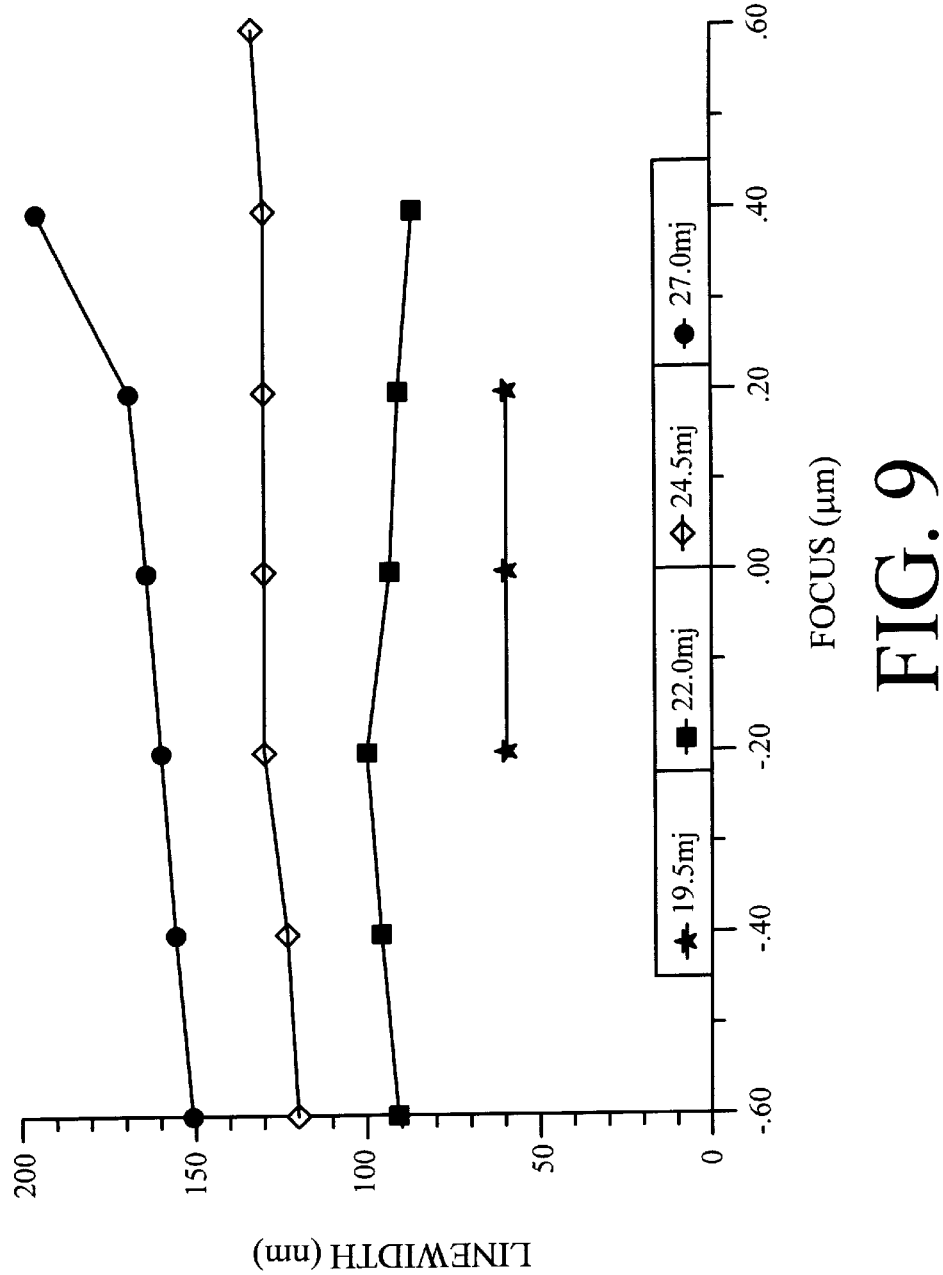
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
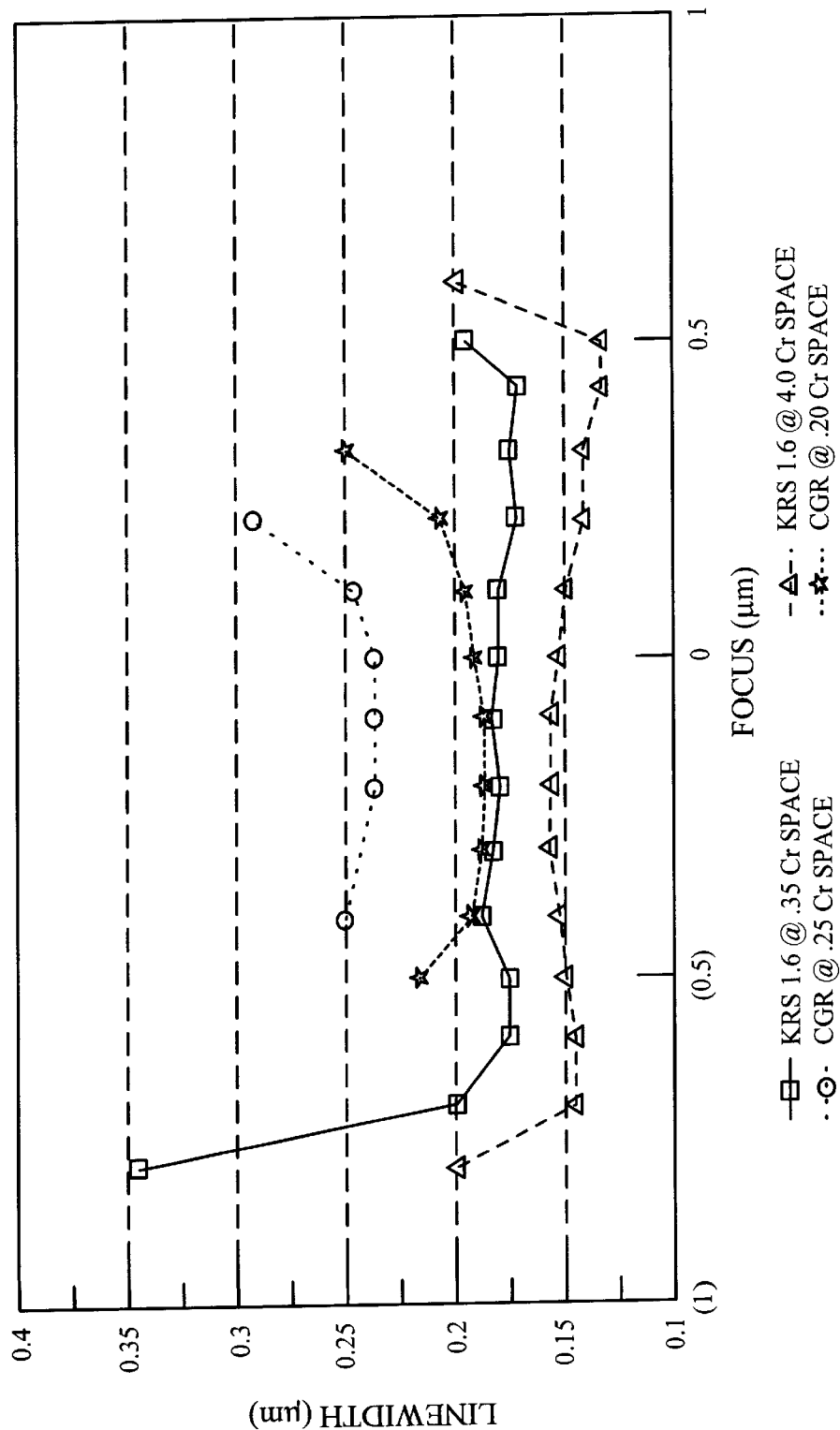
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 $\mu$m larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

In a further processing refinement, the doughnut shaped features that are typically obtained can be trimmed with a second masking step if they are not desired.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (I) aromatic polymers having an —OH group, e.g., polyhydroxystyrenes such as poly (4-hydroxystyrene), poly (3-hydroxystyrene), commercially available from Hoechst Celanese of Corpus Christi, Tex., novolak resins commercially available from Shipley of Marlboro, Mass., and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form, i.e., once the positive tone reaction has occurred is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydiride copolymers, polyhydroxystyrene-p-tertiarybutyl-carganatostyrene co-polymers, poly(2-hydroxystyrene), phenol-formaldehyde resins, polymethyl methacrylate- tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)- p-cresol. However, other possible crosslinking compositions include:

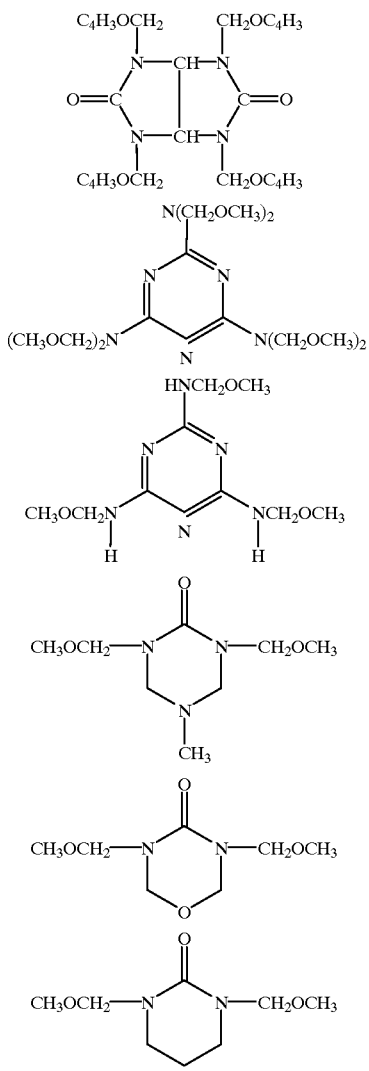

their analogs and derivatives, as can be found in Japanese Laid-Open Patent Application (Kokai) No. 1-293339, as well as etherified amino resins, for example methylated or butylated melamine resins (N-methoxymethyl- or N-butoxymethylmelamine respectively) or methylated/butylated glycol-urils, for example of the formula:

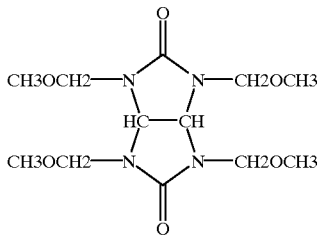

as can be found in Canadian Patent No. 1 204 547.

Photoacid generators ("PAG") include, but are not limited to: N-(trifluoromethylsulfonyloxy)-bicyclo [2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

The casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

In the following Examples, one of each of these has been chosen, however, it is to be recognized that many other compositions may be selected for various portions of the resist, the basis of the functionality of the hybrid photoresist lies in the fact that the hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propylene-glycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3-dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids.

Figure 12:
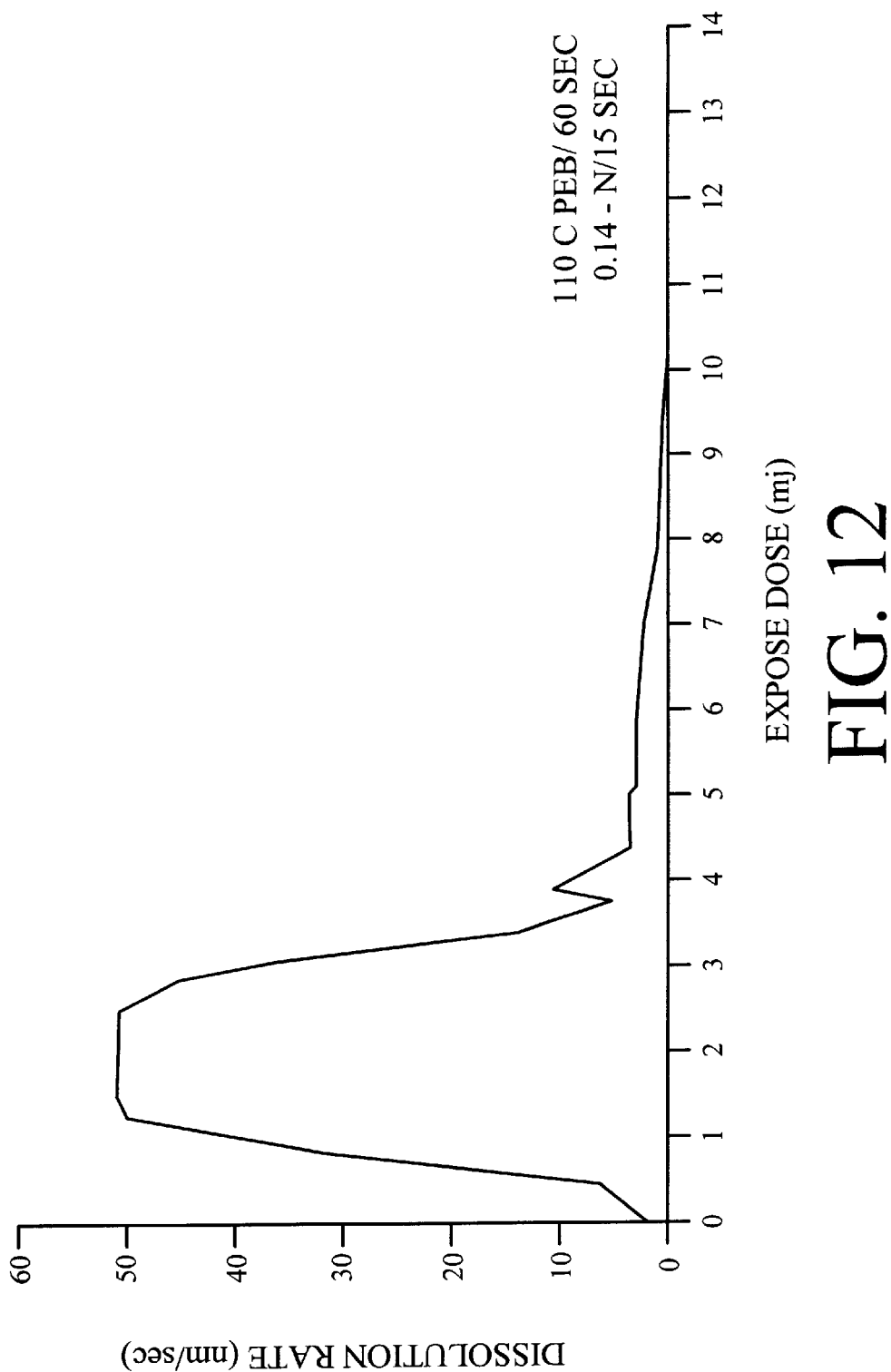
FIG. 12 is a graph showing the dissolution rate in nanometers per second (nm/sec) as a function of the exposure dose in millijoules (mJ) using one formulation of a hybrid resist of the present invention.

The solution was filtered through a 0.2 μm filter. The solution was coated onto silicon wafers primed with hexamethyl- disilazane with a soft bake of 110° Celsius (C) resulting in films of about 0.8 μm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 12. As shown in FIG. 12, the resist has a very low dissolution rate (about 2 nm/sec) when unexposed. As the dose is increased, the dissolution rate increases until reaching about 50 nm/sec. The dissolution rate remains relatively constant at this level in the dose range of about 1 milliJoule (mJ) to about 3 mJ. Increasing the dose further, the negative cross-linking chemistry becomes predominant and the dissolution rate falls back to a value close to zero.

Figure 16:
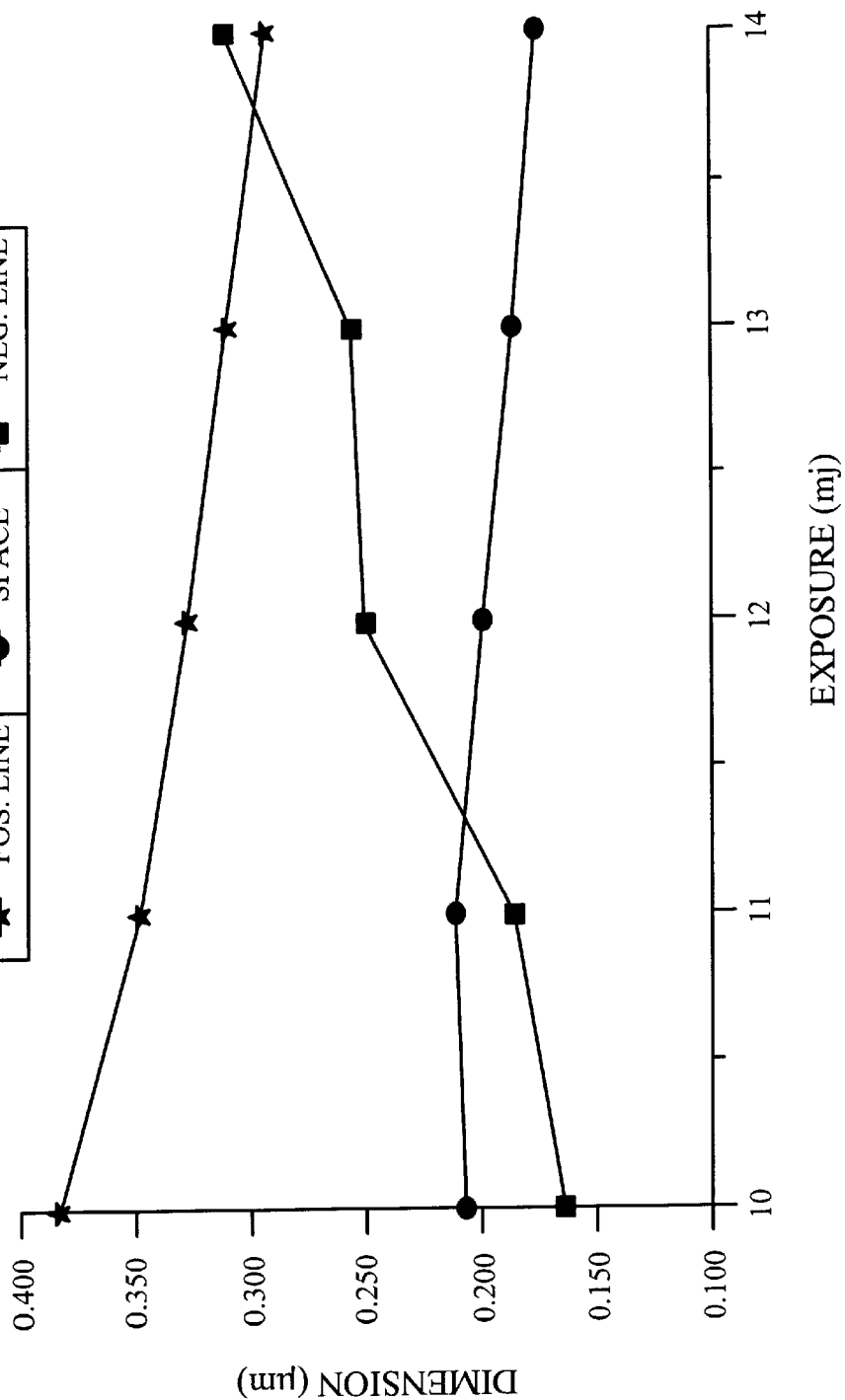
FIG. 16 is a graph of the response of a formulation of the hybrid resist of the present invention in which exposed (negative) line, unexposed (positive) line and space widths are plotted as a function of exposure dose.

A typical lithographic response of this resist is illustrated in FIG. 16, which shows the outcome of exposing the resist through a mask having 1 μm wide nested chrome lines at a pitch of 2 μm with a 248 DUV stepper with a 0.37 NA. Every chrome line and space combination in the mask prints as two lines and two spaces on the resist: a negative line of about 0.8 μm, a positive tone line of about 0.6 μm and two equal spaces of about 0.3 μm.

Figure 13:
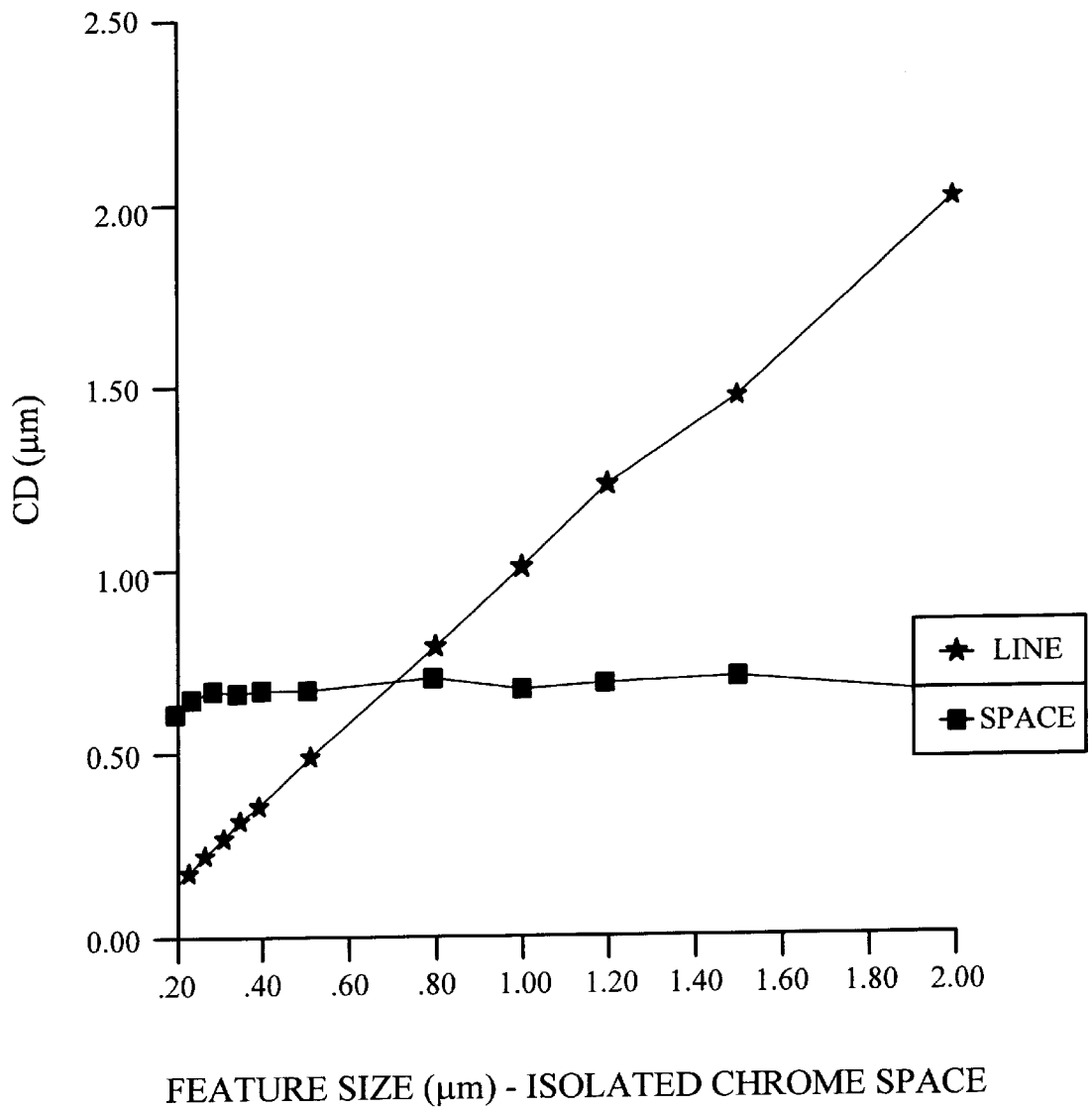
FIG. 13 is a graph showing the resultant line and space widths as functions of the chrome space width using one formulation of a hybrid resist of the present invention.

In another experiment with the same resist, when a NICRASCAN II 0.5 NA DUV stepper is used to expose an isolated chrome space onto the hybrid resist film, the space/line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids tetrabutyl ammonium hydroxide base, 0.1% of solids; and sufficient PM acetate containing 350 ppm FC-430 surfactant as a solvent to form a 18.9% solids solution.

Figure 14:
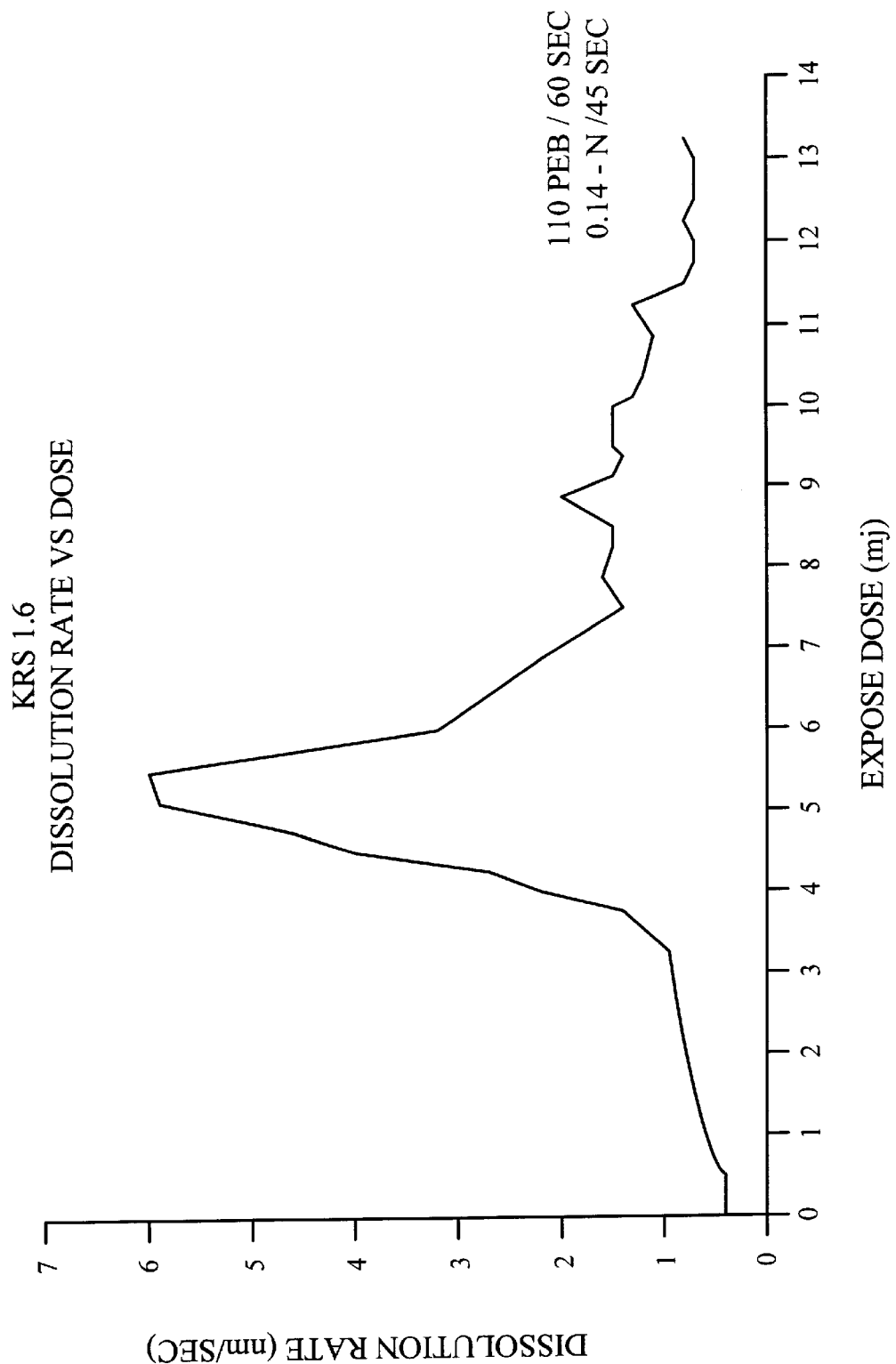
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of mask dimension. The space remains relatively constant in the range of about 0.18 μm, whereas both lines vary as the mask dimension is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 μm. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5 NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter (cm$^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 μm was observed for the hybrid resist relative to the standard negative resist, as calculated using standard methods known in the art.

Using the examples presented above, a hybrid photoresist material that will be suitable for use in a preferred embodiment of the present invention can be formulated.

DETAILED DESCRIPTION

According to the present invention, an improved method for buried diode formation in CMOS processing is disclosed. Using a hybrid photoresist material and process, a self-aligning buried Zener diode is created using a two-step photolithography mask process. Since the process disclosed in the invention uses only the p-well and the n-well masks to create the Zener diode, photolithography alignment problems are reduced and Zener diodes can be effectively created at the sub-micron scale.

Figure 17:
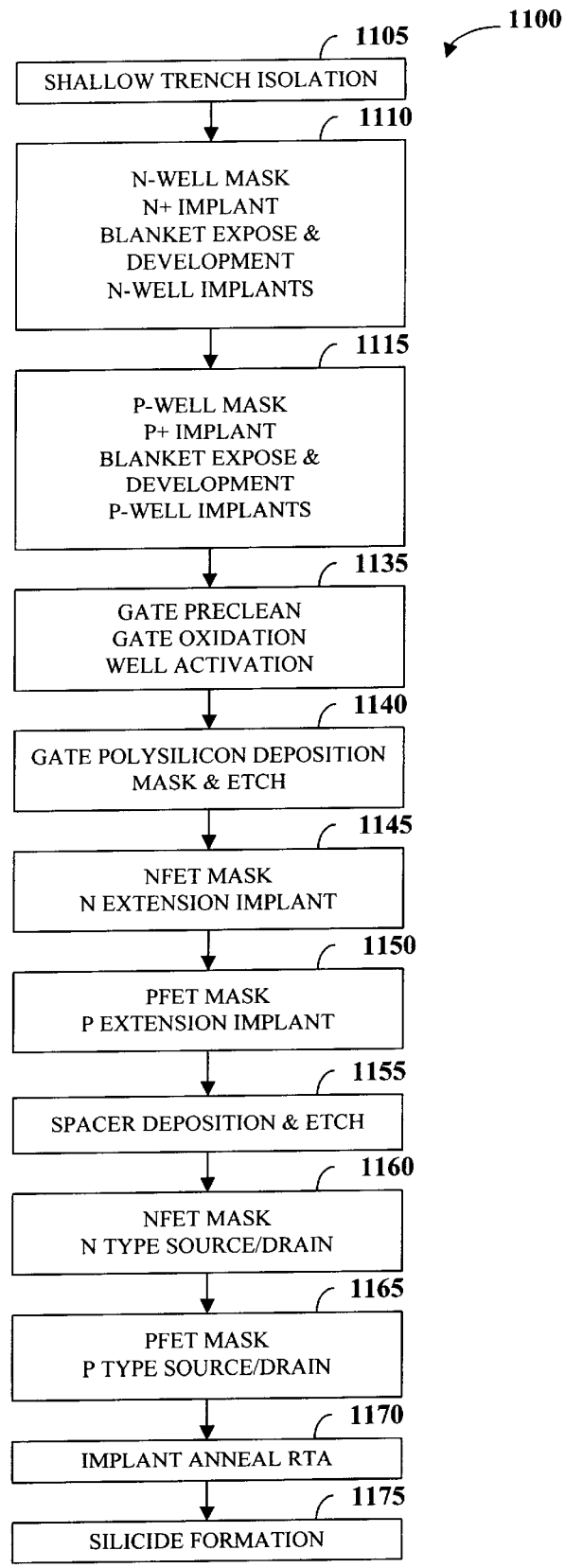
FIG. 17 is a flow diagram representing a fabrication method in accordance with the preferred embodiment.

Turning to FIG. 17, a preferred method 1100 for forming well edge implants which can be used to create buried Zener diodes in CMOS devices is illustrated. The method 1100 forms Zener diodes from well edge implants without requiring additional mask steps beyond the n-well mask and p-well mask.

A preferred embodiment of the present method begins with a semiconductor substrate as is commonly used in CMOS devices. An example of such a substrate is a wafer with a P+ substrate and a P− epitaxial layer at the top portion. Of course, other suitable substrate materials can be used and are well known to those skilled in the art.

The first step, step 1105, is to form isolation regions between devices. As explained above, these isolation regions, preferably shallow trench isolation, are used to separate n-channel from p-channel devices. The STI can be formed with any suitable processing method. One such method uses reactive ion etching (RIE) to form trenches in the substrate. An oxide liner is then suitably grown on the walls of the STI trench. The STI trench is then filled, suitably with an oxide material, and the wafer is planarized using a chemical mechanical polish (CMP) process.

Next, step 1110 is performed to create the N-wells and the N-well edge implants, by forming N-well patterns with hybrid resist and opening the edge spaces at the N-well edges using the hybrid resist properties. The hybrid photoresist material described above is first deposited across the surface of the wafer. The hybrid resist is then exposed to actinic radiation with the areas which are to be N-wells blocked with suitable mask shapes (i.e., chrome mask shapes). The hybrid resist is then developed. Areas which are unexposed (i.e., the N-well regions) remain insoluble in the developer and form positive tone line patterns. Areas which are exposed with high intensity radiation (i.e., the non-N-well regions) form a negative tone line image. Areas which are exposed with intermediate amounts of intensity (i.e., the edges of the N-Well regions) are dissolved during the development step.

Next, the N-well edge implants are formed though the well edge spaces. In a preferred embodiment, the N-well edge implants preferably comprise a N+ region around the edges of the N-well. The implants are preferably formed by implanting phosphorus (or other suitable donor species) through the well edge shapes. The amount of the implant is selected to achieve the preferred diode breakdown voltage and reverse biased leakage current. This, in turn, will depend on factors such as the background doping, the spacing of the structures, and the desired Zener or avalanche condition. As such, one preferred implant would be phosphorous with a dose of $1\times10^{13}$. A suitable dose in the range of $1\times10^{12}$–$5\times10^{15}$ may also be used. The implant energy should be chosen such that the implant depth in to the wafer is sufficient to place the dopant beneath the STI.

The next step is to expose and develop the N-well regions of the hybrid resist. Because the hybrid resist portion above the N-well regions were unexposed, it comprises positive tone patterns. Thus, the hybrid resist portions above the N-well regions can be removed by blanket exposing the wafer portion and developing away the positive tone patterns. Thus, this removal can be done without requiring additional masking layers or masking steps.

At the next step, N-wells are formed using any suitable N-type implant technique. With the N-wells formed, the remaining portions (i.e., the negative tone portions 2208) of the hybrid resist are stripped.

Once the N-wells and the N-well edge implants have been formed, P-wells and the P-well edge implants can be created by a similar series of process steps (step 1115). The P-well pattern is formed with hybrid resist and well edge spaces are formed at the P-well edges using the hybrid resist properties.

Again, hybrid resist is first deposited across the surface of the wafer. The hybrid resist is then exposed to actinic radiation with the areas which are to be P-wells blocked with suitable mask shapes (i.e., chrome mask shapes). The hybrid resist is then developed. Areas which are unexposed (i.e., the P-well regions) remain insoluble in developer and form a positive tone line pattern. Areas which are exposed with high intensity radiation (i.e., the non-P-well regions) form a negative tone line image. Areas which are exposed with intermediate amounts of intensity (i.e., the edges of the P-Well regions) are dissolved during the development step.

The next step in the process is to form P-well edge implants though the well edge spaces. The P-well edge implants preferably comprise a P−region around the edges of the P-well. The implants are preferably formed by implanting boron (or other suitable acceptor species) through the well edge shapes. Again, the amount of the implant is selected to achieve the preferred diode breakdown voltage and reverse biased leakage current. This, in turn, will depend on factors such as the background doping, the spacing of the structures, and the desired Zener or avalanche condition. As such, one preferred implant would be boron with a dose of $1\times10^{13}$. A suitable dose in the range of $1\times10^{12}$–$5\times10^{15}$ may also be used. The implant energy should be chosen such that the implant depth in to the wafer is sufficient to place the dopant beneath the STI.

In order to form the P-wells, it is necessary to expose and develop the P-well regions of the hybrid resist. Because the hybrid resist portion above the P-well regions were unexposed, they comprises positive tone patterns. Thus, the hybrid resist portions above the P-well regions can be removed without requiring additional masking steps by blanket exposing the wafer portion and developing away the positive tone patterns. P-wells are preferably formed using any suitable P-type implant technique.

The remaining process steps illustrated in FIG. 17 are well known to those skilled in the art and are typical process steps for fabricating integrated circuit devices.

The remaining figures will be used to graphically depict a method of fabricating a Zener diode in accordance with a preferred embodiment of the present invention.

Figure 18:
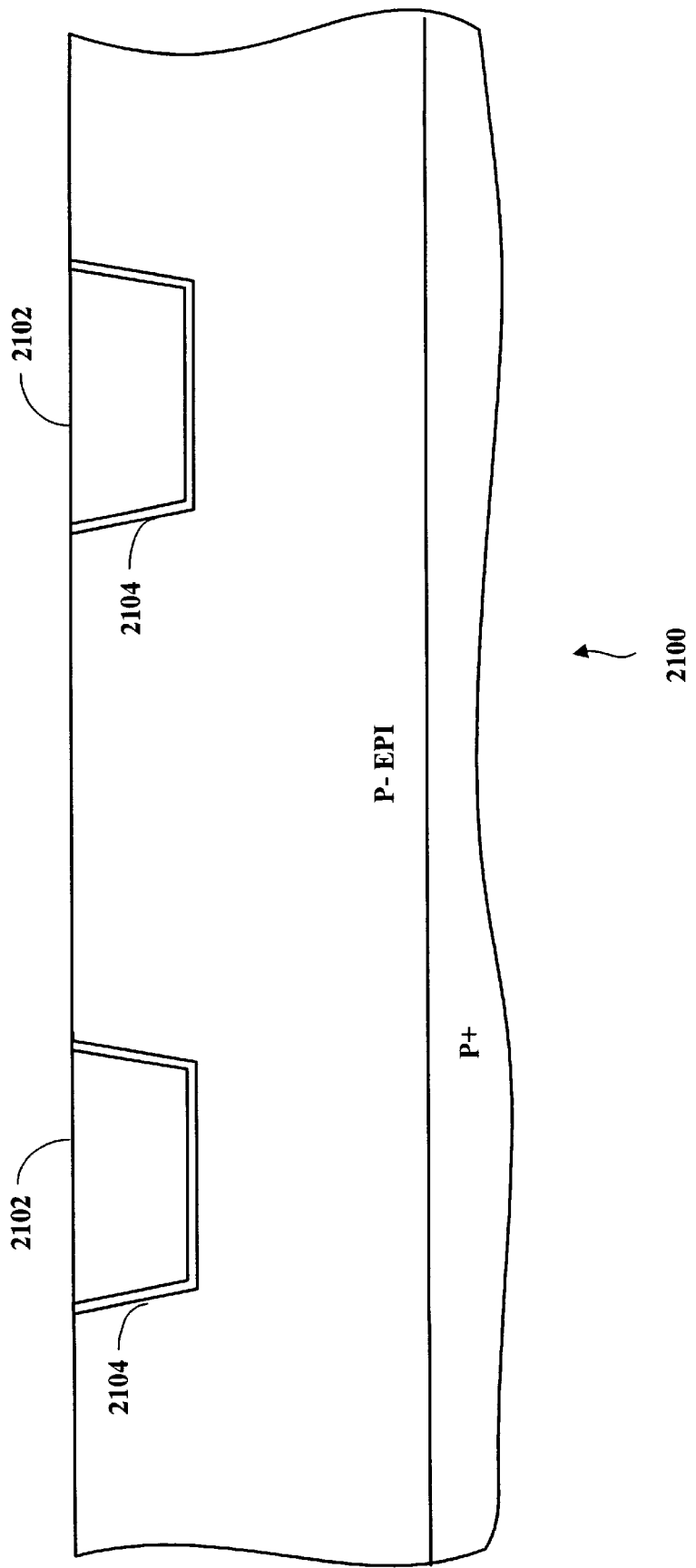
FIG. 18 is a cross-sectional side view of a wafer portion with shallow trench isolations formed within.

Referring now to FIG. 18, a wafer portion 2100 is schematically illustrated (not to scale). Wafer portion 2100 includes a P− epitaxial layer atop a P+ substrate. Two shallow trench isolations (STIs) 2102 are formed in wafer portion 2100. STIs 2102 are exemplary of STIs that are suitably formed between various devices in a typical integrated semiconductor device, and include an oxide liner 2104 and an oxide filler 2106. Further processing steps will form n-channel devices and p-channel devices on wafer portion 2100. STIs such as STIs 2102 are suitably formed between these various devices (i.e., between two n-channel devices, between two p-channel devices and between an n-channel and a p-channel device). In all these cases STIs 2102 serve to isolate the individual devices from each other.

As will become clear, a preferred embodiment of the present invention results in less mobility for carriers beneath STIs 2102 and thus allows STIs 2102 to be shallower than prior art STIs and still maintain effective isolation between devices. Thus, a preferred embodiment of the invention improves the scalability of STIs without adverse impact to circuit operation.

Figure 19:
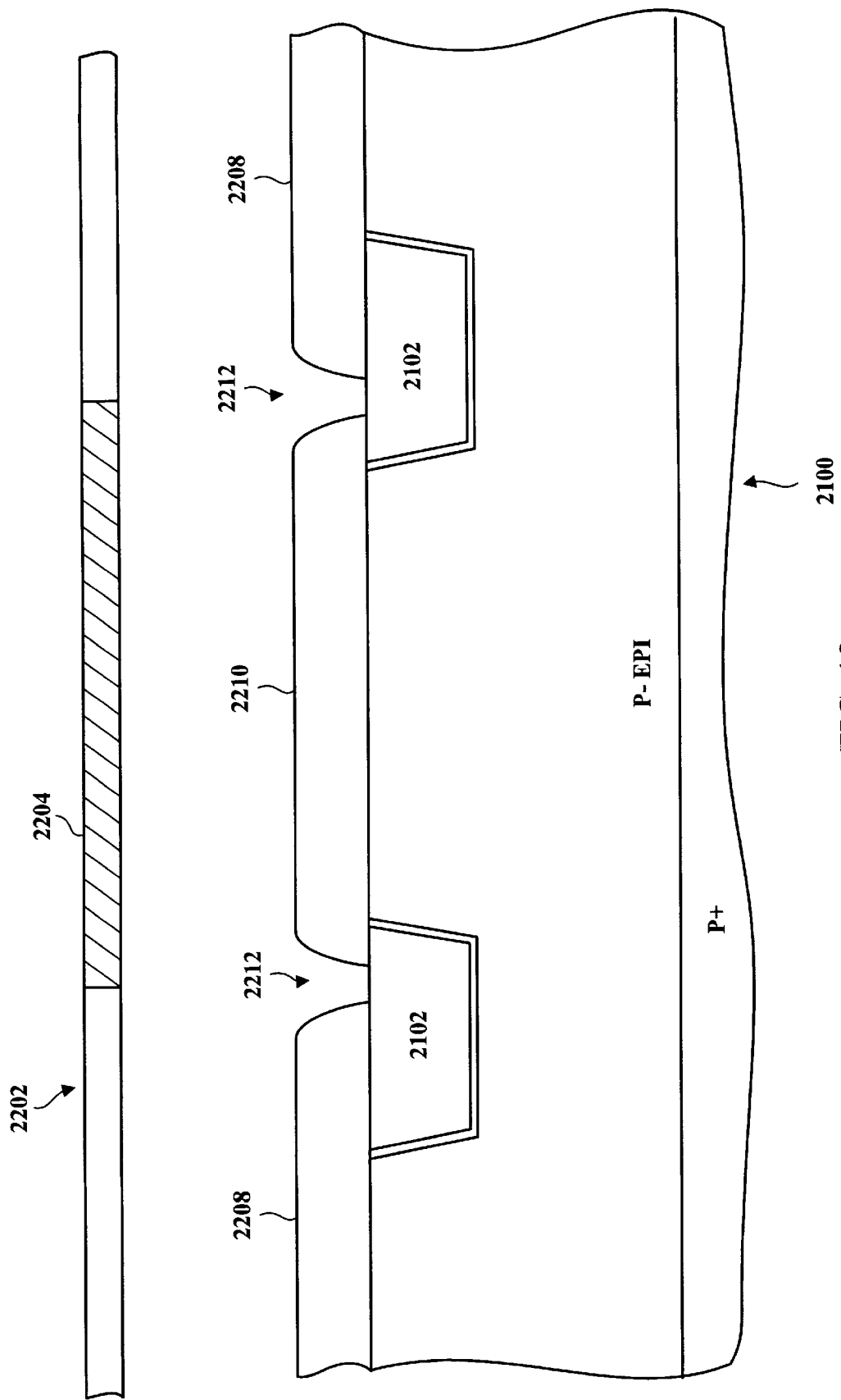
FIG. 19 is a cross-sectional side view of a wafer portion overlaid with hybrid resist and a mask used to pattern the resist for N-well edge implant formation and N-well formation.

Referring now to FIG. 19, wafer portion 2100 is illustrated with hybrid resist deposited across the surface that has been exposed and developed. A chrome region 2204 in a mask 2202 blocks the N-well regions during actinic radiation exposure. Thus, the N-well regions are unexposed and non-N-well regions are highly exposed, with areas of intermediate exposure in between. After development, a positive tone line pattern 2210 is formed above the N-well region and negative tone line patterns 2208 are formed above the non-N-well regions. Areas that were exposed to intermediate amounts of radiation are dissolved during developing, forming well edge spaces 2212 at the edges of the N-well regions. Because of the unique properties of hybrid photo resist, the spaces can be with dimensions of 0.2 μm or less using lithography tools that are designed for operation at 0.35 μm resolution.

Figure 20:
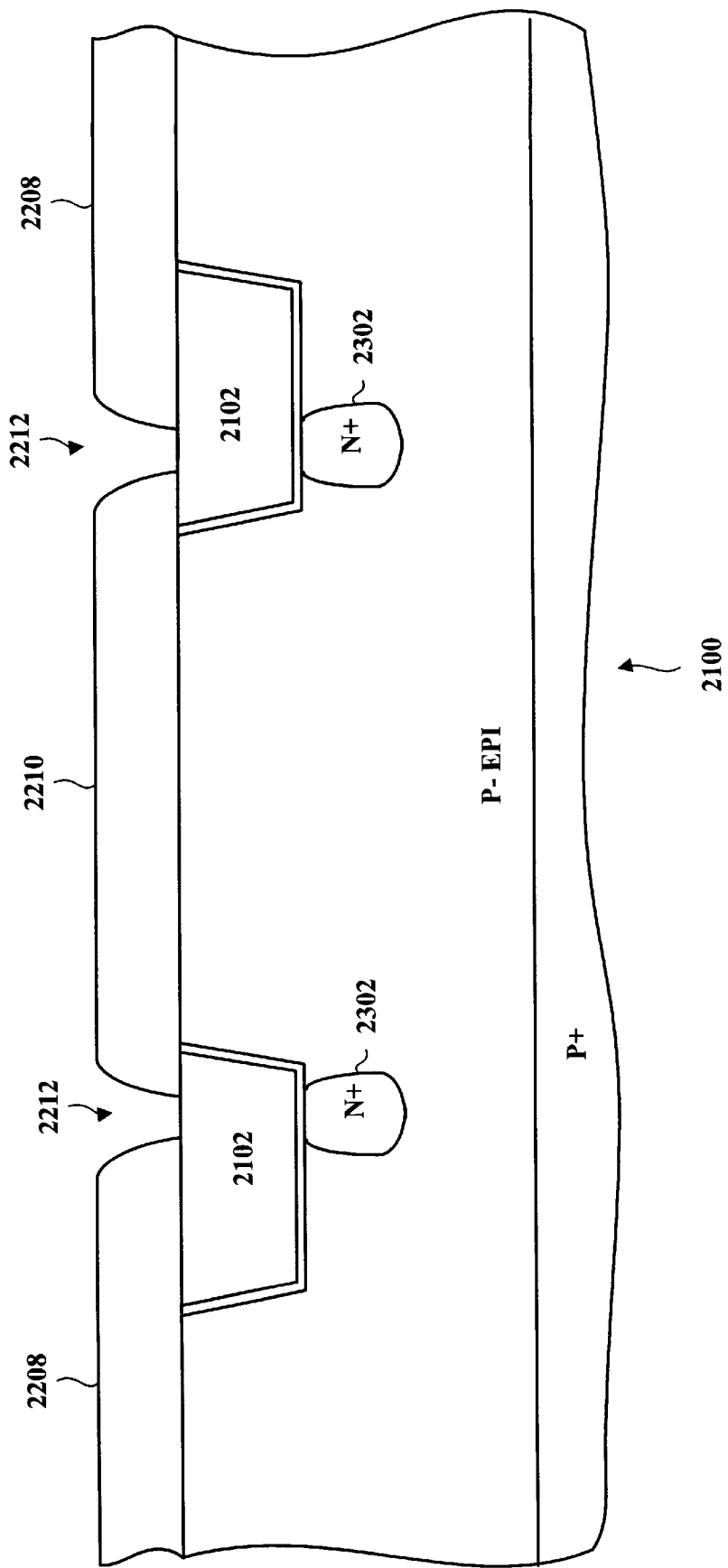
FIG. 20 is a cross-sectional side view of a wafer portion with N-well edge implants formed.

Referring now to FIG. 20, wafer portion 2100 is illustrated with n-well edge implants 2302 formed, as described above with respect to step 1110 or FIG. 17.

Figure 21:
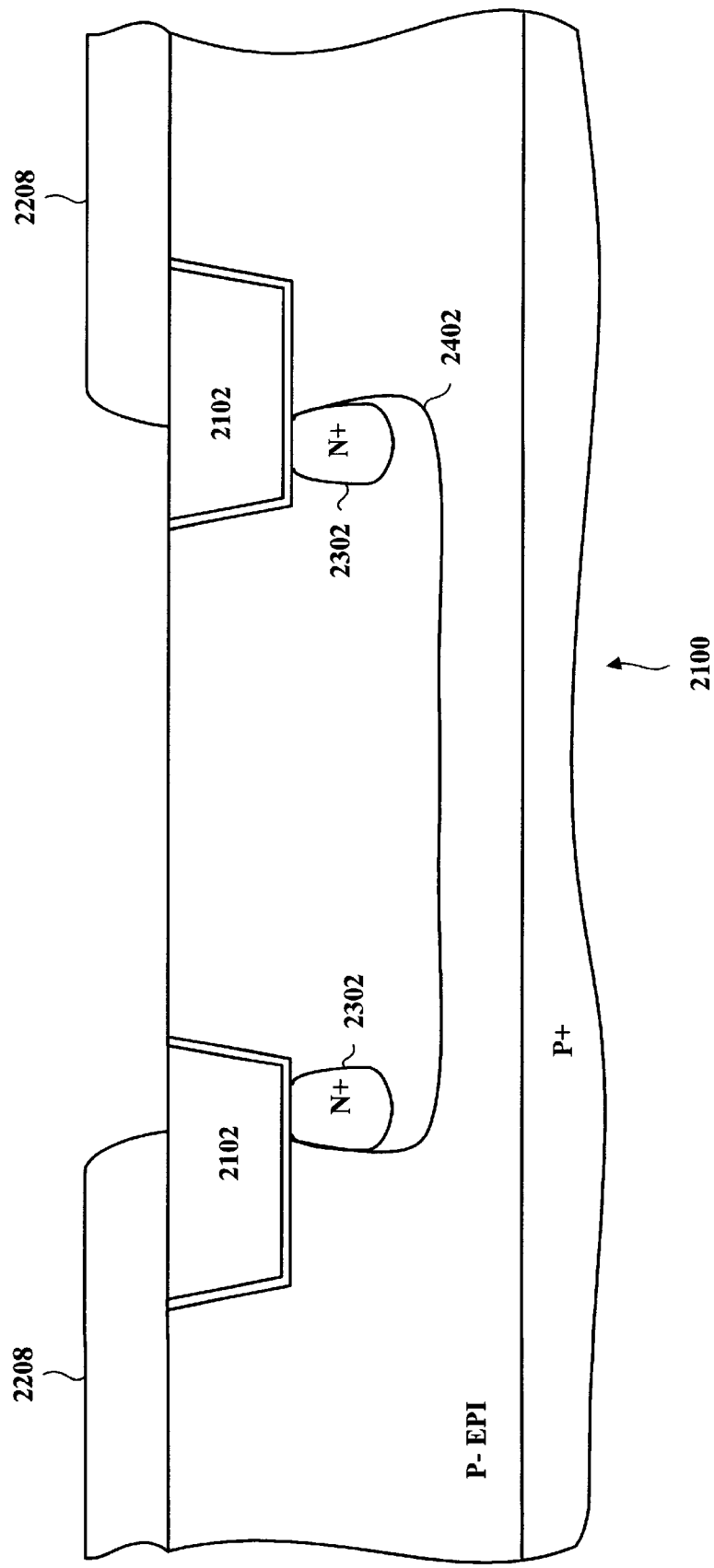
FIG. 21 is a cross-sectional side view of a wafer portion with N-well edge implants and the N-well formed.

Referring now to FIG. 21, wafer portion 2100 is illustrated with the positive tone portion 2210 of the hybrid resist removed and an N-well 2402 implanted into substrate 2100. The remaining negative tone portions serve to mask off the non-N-well regions and prevent them from receiving the N-type 10 implant. Because the same negative tone resist structure defines N-well 2402 and N-well edge implants 2302, they are self aligned with each other.

Figure 22:
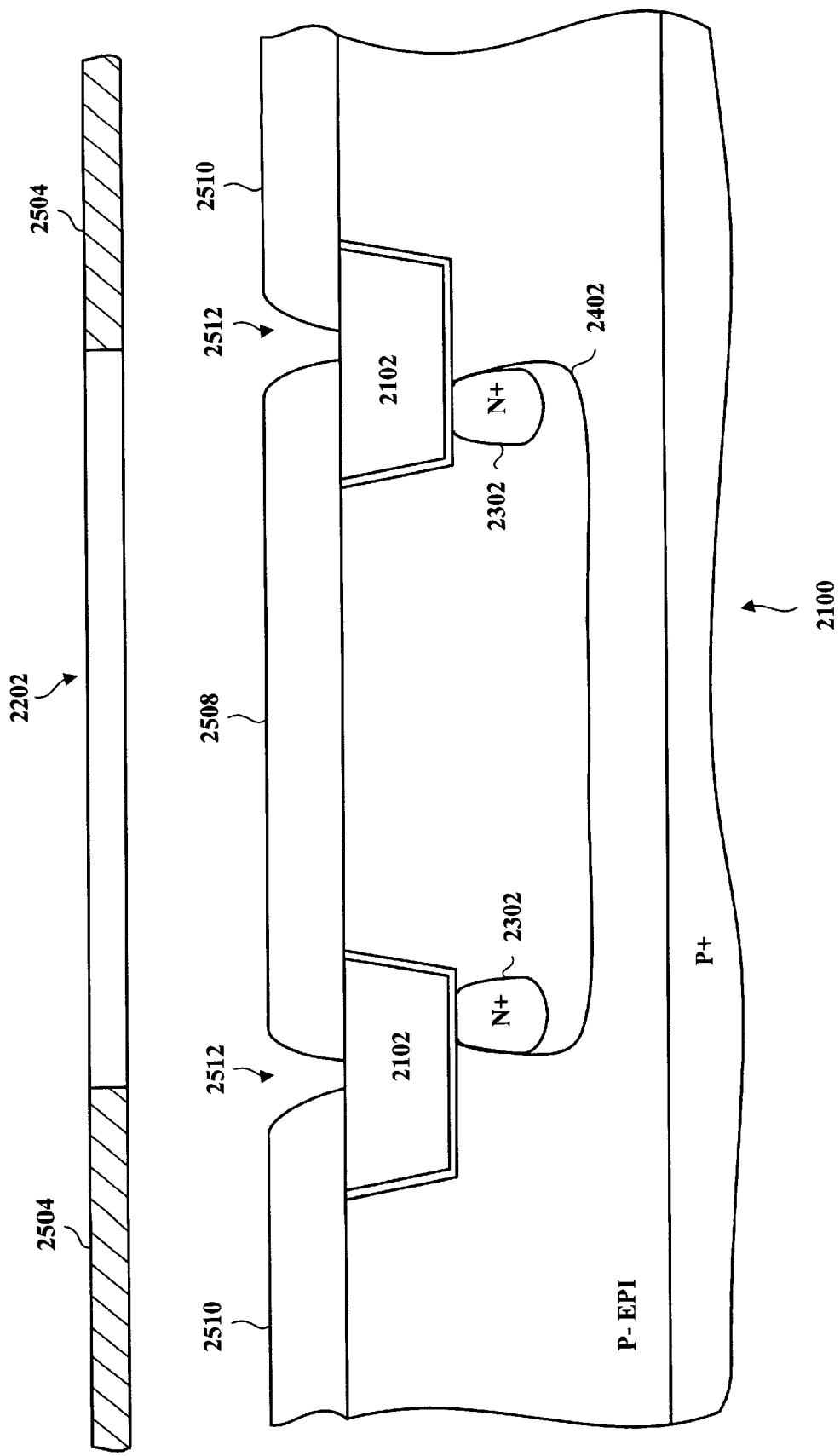
FIG. 22 is a cross-sectional side view of a wafer portion overlaid with hybrid resist and a mask used to pattern the resist for P-well edge implant formation and P-well formation.

Referring now to FIG. 22, wafer portion 2100 is illustrated with hybrid resist deposited across the surface that has been exposed and developed. Chrome regions 2504 in mask 2502 block the P-well regions during actinic radiation exposure. Thus, the P-well regions are unexposed and non-P-well regions are highly exposed, with areas of intermediate exposure in between. After development, positive tone line patterns 2510 are formed above the P-well regions and a negative tone line pattern 2508 is formed above the non-P-well regions. Areas that were exposed to intermediate amounts of radiation are dissolved during developing, well-region edge spaces 2512 at the edges of the P-well regions. Again, because of the unique properties of hybrid photo resist, the spaces can be made with dimensions of 0.2 μm or less using lithography tools that are designed for operation at 0.35 μm resolution.

Figure 23:
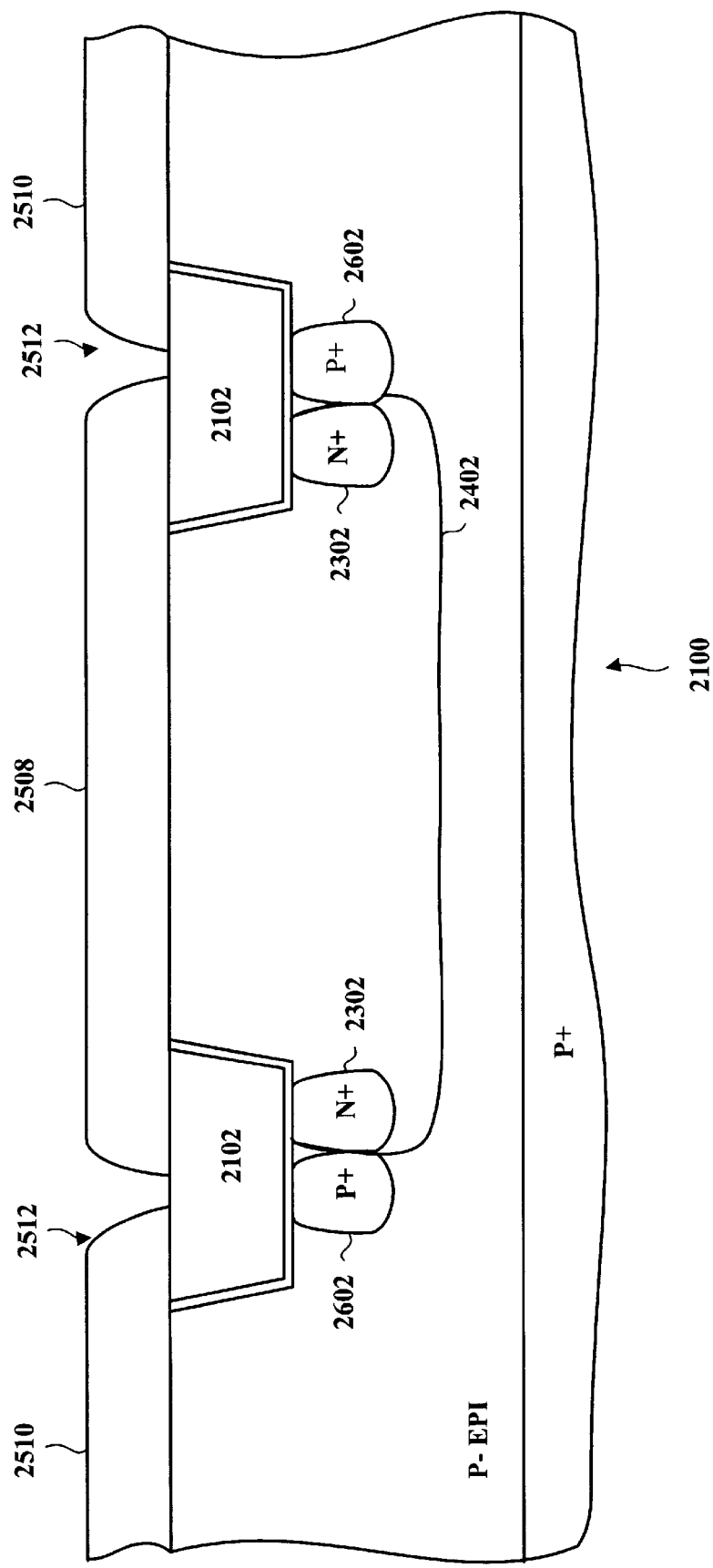
FIG. 23 is a cross-sectional side view of a wafer portion with P-well edge implants.

Referring now to FIG. 23, wafer portion 2100 is illustrated with P-well edge implants 2602 formed. Then, the remaining portions of the hybrid resist are stripped. With the P-wells formed, the next step is to retrograde and channel Vt. Then, the remaining portions of the hybrid resist are removed.

Figure 24:
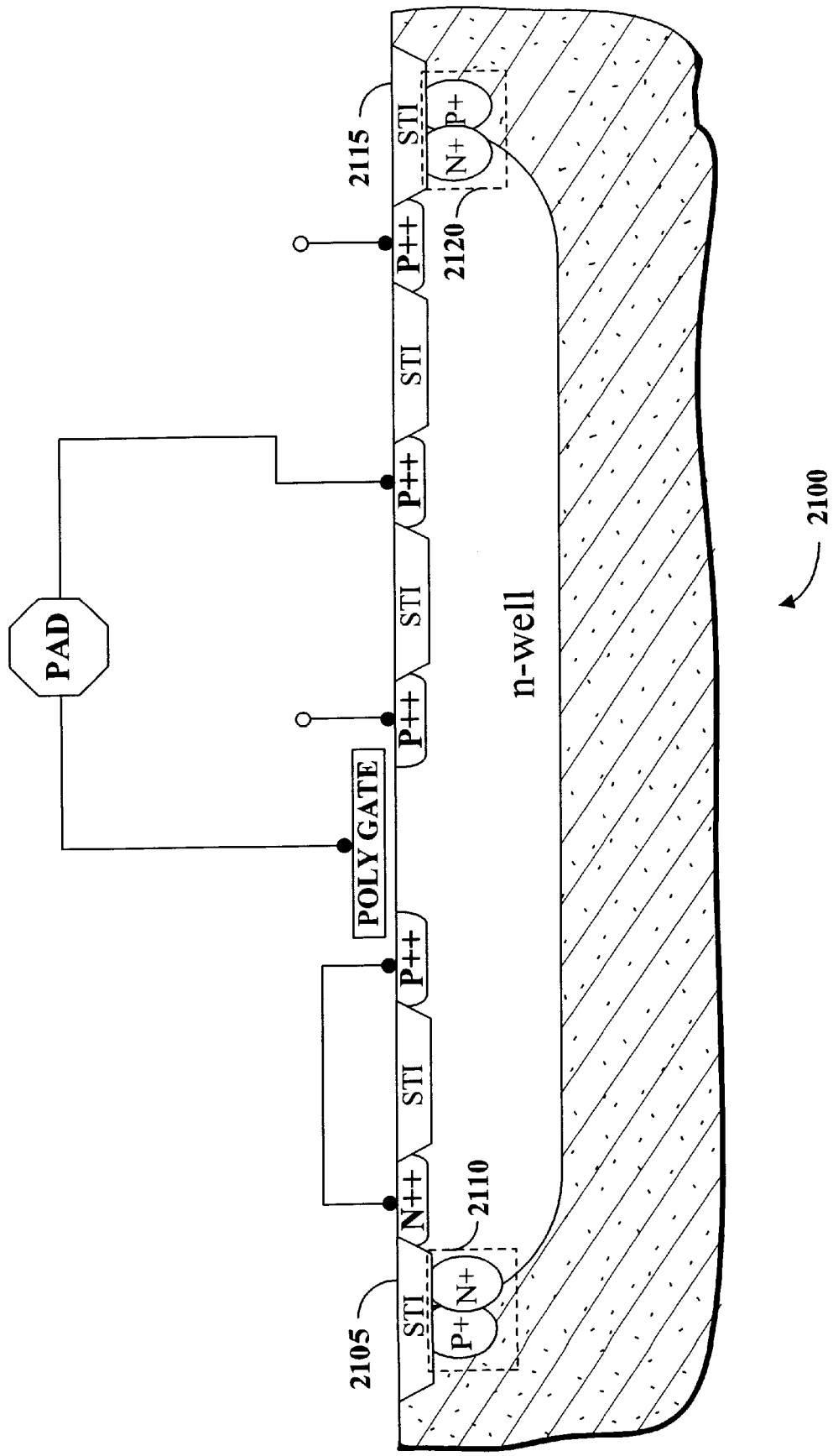
FIG. 24 is a circuit with Zener diodes formed according to a preferred embodiment of the present invention.

The wafer portion 2100 can then be completed using suitable fabrication techniques, i.e., forming the device gates and the diffusion regions. Turning to FIG. 24, the wafer portion 2100 is illustrated with the N++ and P++ diffusion regions formed. These diffusion regions are typically formed at the lower edges of the gate structures. (not shown in FIG. 24). In addition, buried Zener diodes 2110 and 2120 are shown under STI 2105 and 2115, respectively.

Thus, the preferred embodiments of the present invention provide a method and structure for forming buried Zener diodes by using a hybrid photoresist and forming edge implants at the edge of the P-wells, N-wells and/or twin-wells. By using the unique properties of hybrid photoresist, the edge implants are self aligned to the wells and are formed without requiring the additional masking steps of conventional Zener diode fabrication processes.

Several applications for specific preferred embodiments of the present invention, illustrated by circuit schematics and wafer cross sections, for Zener diode semiconductor devices follows. It should be noted that the figures described below represent only a small portion of the surface of a typical semiconductor wafer or small sections of actual circuits. The method of the present invention may be successfully implemented using other surface structures and circuits by those skilled in the art. Additional structures and layers, although not shown, may be present on the surface of the semiconductor wafers depicted below.

Figure 25:
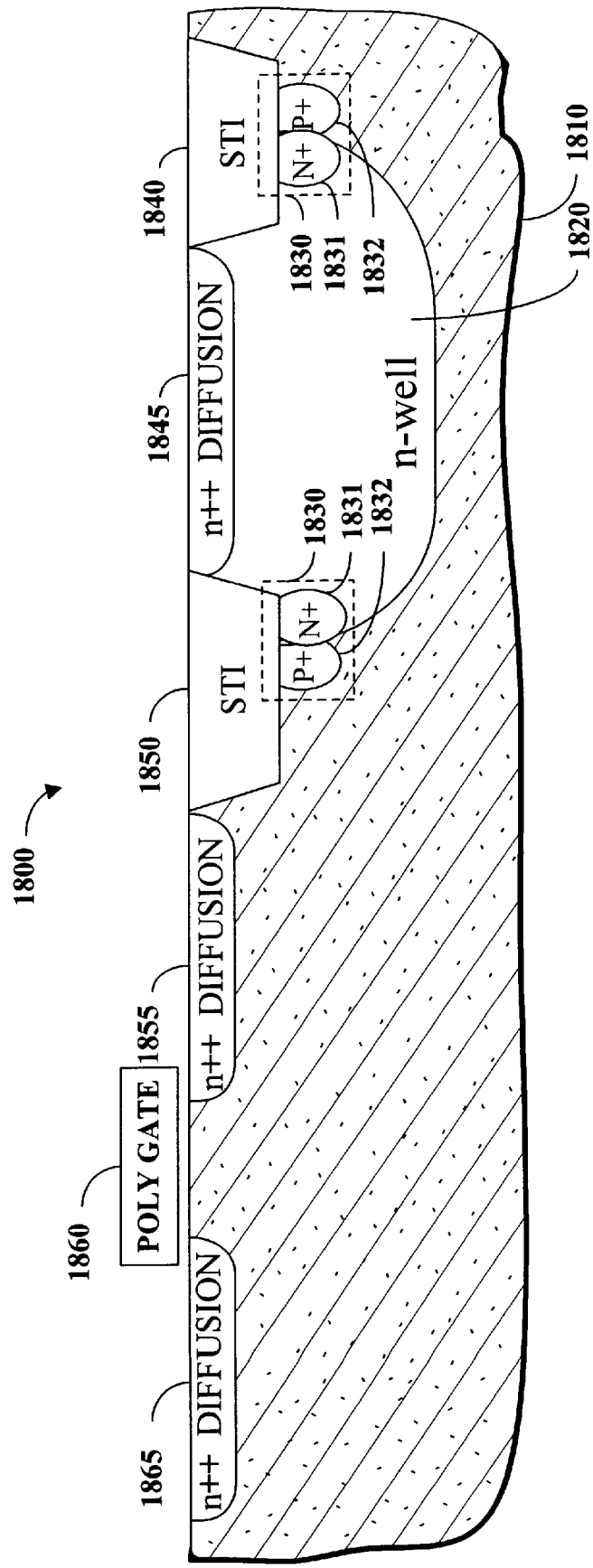
FIG. 25 is a wafer level view of an ESD protection circuit with Zener diodes formed according to a preferred embodiment of the present invention.

Referring now to FIG. 25, a wafer structure 1800 containing devices fabricated according to a preferred embodiment of the present invention includes: substrate 1810; n-well 1820; STI diffusions 1840 and 1850; n++ diffusions 1845, 1855, and 1865; poly gate 1860; and Zener diodes 1830. Zener diodes 1830 are fabricated according to the method described above and contain P+ implants 1832 and N+ implants 1831.

Figure 26:
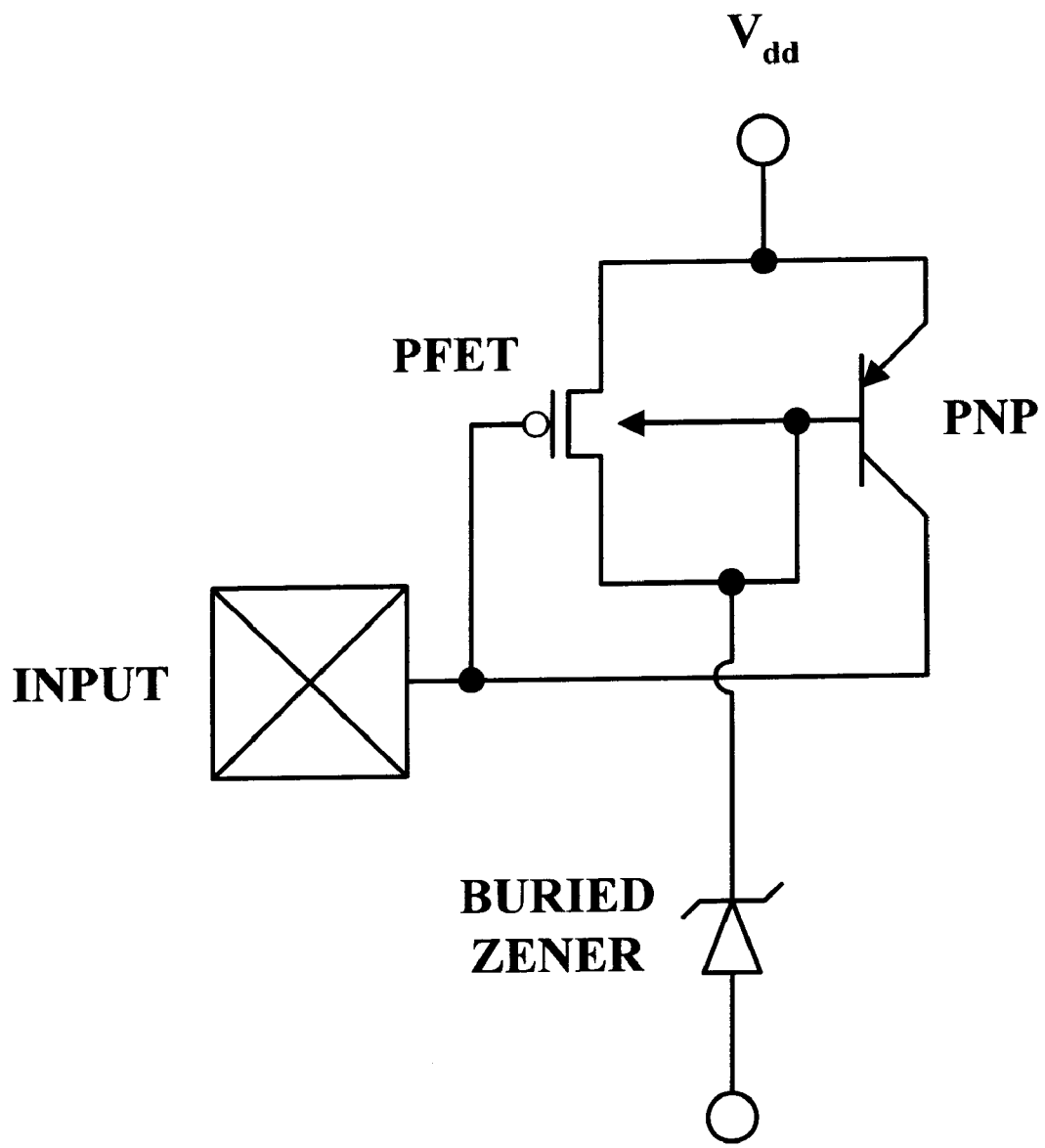
FIG. 26 is a schematic of the ESD protection circuit of FIG. 25.

Referring now to FIG. 26, an ESD protection circuit in accordance with a preferred embodiment of the present invention includes: a PFET control transistor; a pnp transistor and a buried Zener diode. Using this circuit, the polysilicon portion of the wafer can be electrically isolated and the Zener diodes can be used to protect the gate from ESD.

Figure 27:
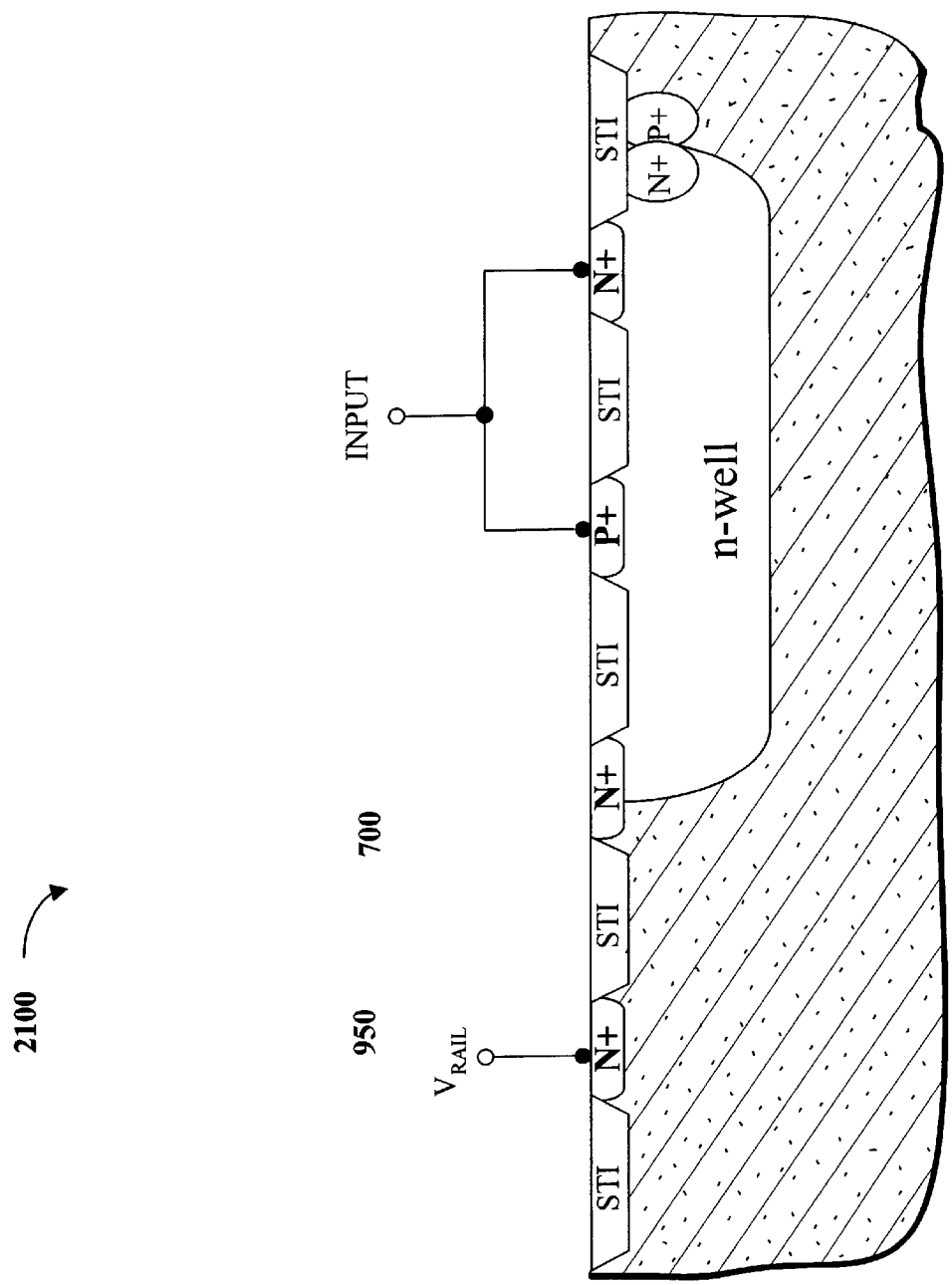
FIG. 27 is a wafer level view of an ESD protection circuit with a Zener diode according to another preferred embodiment of the present invention.
Figure 28:
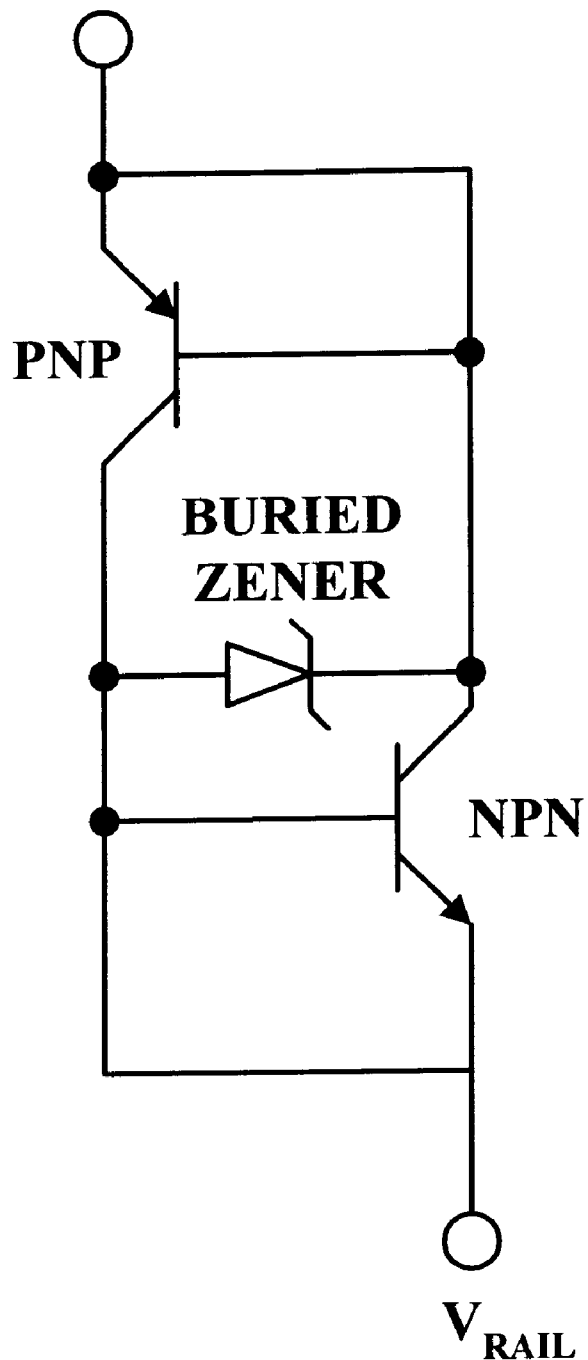
FIG. 28 is a schematic of the ESD protection circuit of FIG. 27.

Referring now to FIG. 27 and 28, a floating well ESD network includes a circuit according to a preferred embodiment of the present invention. The circuit shown in FIG. 27 uses a self-biased well PFET control transistor, a lateral and vertical pnp and uses the buried Zener diode as an overvoltage clamp. The operation of this circuit is such that when the pad node is "low" relative to the Vdd power supply, the PFET transistor is "on," charging the n-well to the level of the Vdd power supply voltage. When the pad node is "high" relative to the power supply voltage, the PFET shuts off, allowing the pad to reach the input voltage potential (e.g., Vpad−Vbe). This provides sequence independence, and avoids continuous d.c. current flow from the pad to the Vdd power supply. With the addition of the buried Zener diode, as the pad voltage is raised, a forward diode voltage (Vbe) above the Zener breakdown voltage, the n-well will be clamped at the Zener breakdown voltage level. Hence, this circuit provides sequence independence and overvoltage clamping for noise, ESD, or overcurrent or overvoltage conditions.

Figure 29:
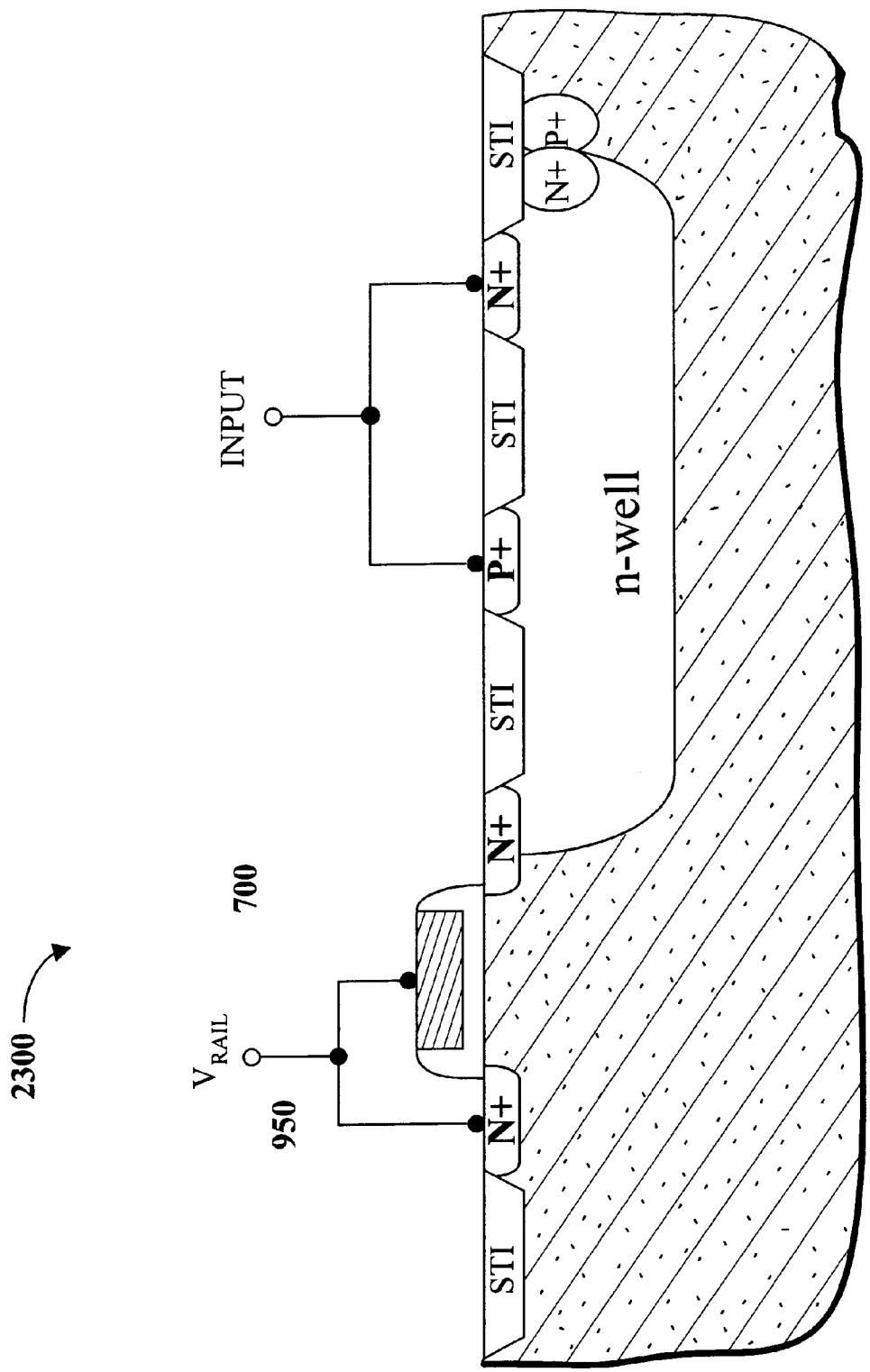
FIG. 29 is a wafer level view of an ESD protection circuit with a Zener diode according to another preferred embodiment of the present invention.
Figure 30:
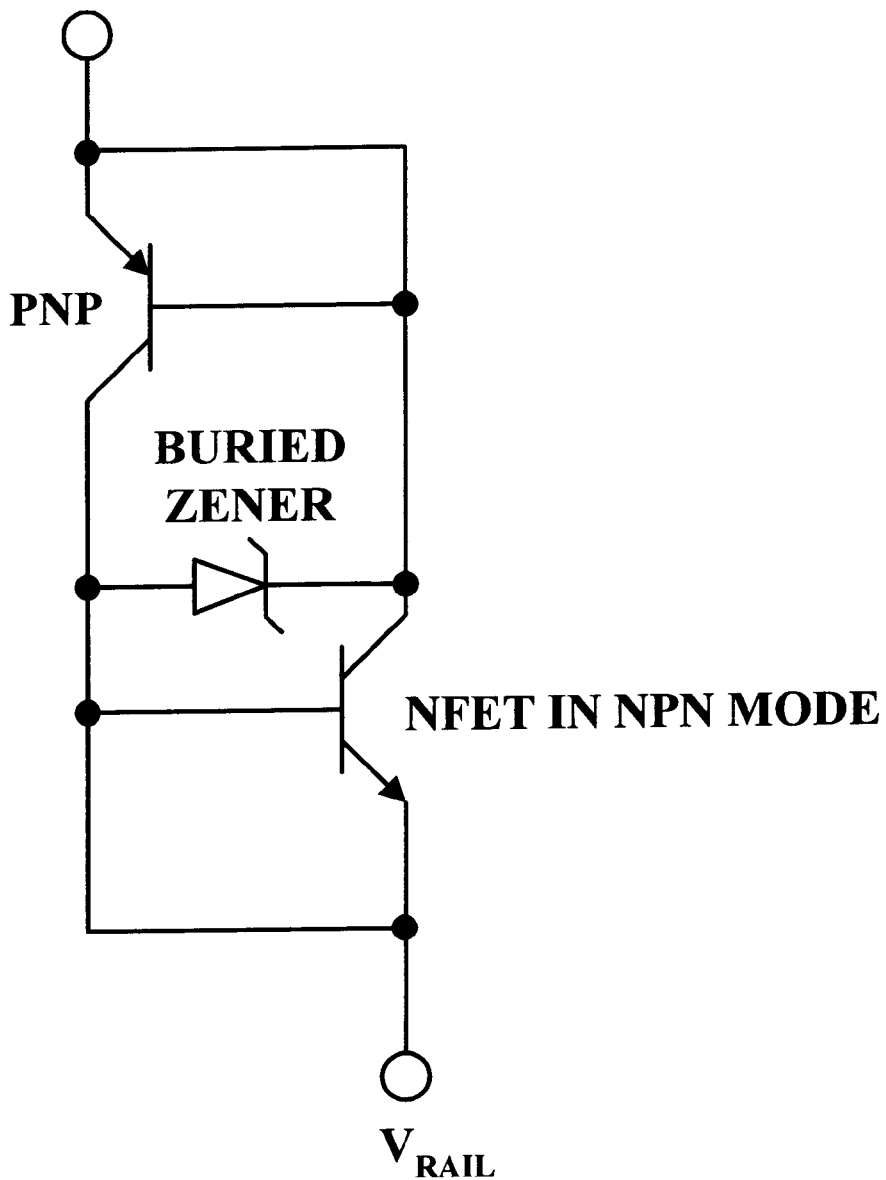
FIG. 30 is a schematic of the ESD protection circuit of FIG. 29.

Referring now to FIGS. 29 and 30, a silicon controlled rectifier ESD network includes a Zener diode fabricated according to a preferred embodiment of the present invention. The circuit shown in FIGS. 29 and 30 is a low voltage triggered ESD circuit suitable for use in STI applications. The ESD network is a low-voltage triggered circuit. In circuit 30, when the pad voltage is raised to exceed the Zener breakdown voltage, the Zener diode breakdown current acts as a pnp base drive, causing the pnp transistor to turn on. As a result of the pnpn intercoupling, this invokes a feedback response, firing the pnpn SCR structure where the NFET transistor acts as an npn device.

While the present invention has been particularly shown and described with reference to certain preferred embodiments thereof, it will be understood by those skilled in the art that various changes in form and details may be made therein without departing from the spirit and scope of the invention. For example, it is to be understood by those skilled in the art that the present invention may be applied to different isolation technologies (e.g. LOCOS, ROX, STI, etc.), well and substrate technologies, dopant types, dopant energies, and dopant species. It is understood that the concepts of the invention are equally applicable to other silicon-based manufacturing technologies (e.g. BICMOS, bipolar, SOI, SiGe, etc.)

We claim:

1. A buried Zener diode comprising:
   a) a well region formed in a semiconductor substrate;
   b) a first well edge implant, the first well edge implant formed at an edge of the well region in the semiconductor substrate, the first well edge implant abutting the edge of the well region; and
   c) a second well edge implant, the second well edge implant formed at the edge of the well region in the semiconductor substrate and wherein the second well edge implant abuts the first well edge implant.

2. The buried Zener diode of claim 1 wherein the first well edge implant comprises an N+ type implant and wherein the second well edge implant comprises a P+ type implant and wherein the well region comprises an N type well region.

3. The buried Zener diode of claim 1 wherein the first well edge implant comprises a P+ type implant and wherein the second well edge implant comprises an N+ type implant and wherein the well region comprises a P type well region.

4. The buried Zener diode of claim 1 wherein the first and second edge implants are formed under a shallow trench isolation.

5. A buried Zener diode comprising:
   a) a semiconductor substrate;
   b) a well region formed in the semiconductor device, the well region having an edge, and
   c) a plurality of well edge implants formed in the well region and the semiconductor substrate wherein at least two of the well edge implants abut each other, and wherein one of the two of the plurality of well edge implants that abut each other is formed in the well region and abuts the edge, and the other of the two of the plurality of well edge implants that abut each other is formed in the substrate.

6. The buried Zener diode of claim 5 wherein one of the two of the plurality of well edge implants that abut each other comprises an N+ type implant and the other well edge implant comprises a P+ type implant and wherein the well region comprises an N type well region.

7. The buried Zener diode of claim 5 wherein one of the two of the plurality of well edge implants that abut each other comprises a P+ type implant and the other well edge implant comprises an N+ type implant and wherein the well region comprises an P type well region.

8. The buried Zener diode of claim 5 wherein the plurality of well edge implants are formed under a shallow trench isolation.

* * * * *